United States Patent
Sano et al.

(10) Patent No.: US 12,527,072 B2
(45) Date of Patent: Jan. 13, 2026

(54) SELF-ALIGNED PATTERNING LAYER FOR METAL GATE FORMATION

(71) Applicant: Taiwan Semiconductor Manufacturing Company, Ltd., Hsinchu (TW)

(72) Inventors: Kenichi Sano, Hsinchu (TW); Yi-Hsiu Chen, Taipei (TW); Pinyen Lin, Rochester, NY (US); Wei-Yen Woon, Taoyuan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 336 days.

(21) Appl. No.: 18/347,813

(22) Filed: Jul. 6, 2023

(65) Prior Publication Data

US 2025/0014947 A1    Jan. 9, 2025

(51) Int. Cl.
*H10D 84/03* (2025.01)
*H10D 30/01* (2025.01)
*H10D 30/62* (2025.01)
*H10D 30/67* (2025.01)
*H10D 62/10* (2025.01)
(Continued)

(52) U.S. Cl.
CPC ......... *H10D 84/038* (2025.01); *H10D 30/014* (2025.01); *H10D 30/024* (2025.01); *H10D 30/6735* (2025.01); *H10D 62/121* (2025.01); *H10D 64/017* (2025.01); *H10D 84/0167* (2025.01); *H10D 84/0188* (2025.01); *H10D 84/0193* (2025.01); H10D 30/6211 (2025.01);
(Continued)

(58) Field of Classification Search
CPC .. H10D 84/038; H10D 30/014; H10D 62/121; H10D 64/017; H10D 84/0167; H10D 30/024; H10D 30/6735; H10D 84/0188; H10D 84/0193; H10D 30/6211
See application file for complete search history.

(56) References Cited

U.S. PATENT DOCUMENTS

2019/0109202 A1   4/2019   Chiang
2021/0366907 A1   11/2021  Liao
(Continued)

FOREIGN PATENT DOCUMENTS

TW        202023020 A    6/2020
TW        202228297 A    7/2022

*Primary Examiner* — Christine A Enad
(74) *Attorney, Agent, or Firm* — HAYNES AND BOONE, LLP

(57) ABSTRACT

Methods of forming a metal gate structure of a stacked multi-gate device are provided. A method according to the present disclosure includes depositing a titanium nitride (TiN) layer over a channel region that includes bottom channel layers and top channel layers, depositing a dummy fill layer to cover sidewalls of the bottom channel layers, after the depositing of the dummy fill layer, selectively forming a blocking layer over the TiN layer along sidewalls of the top channel layers, selectively removing the dummy fill layer to release the bottom channel layers, selectively depositing a first work function metal layer to wrap around each of the bottom channel layers, forming a gate isolation layer over a top surface of the first work function metal layer, removing the blocking layer, releasing the top channel layers, and selectively depositing a second work function metal layer to wrap around each of the top channel layers.

20 Claims, 23 Drawing Sheets

(51) Int. Cl.
*H10D 64/01* (2025.01)
*H10D 84/01* (2025.01)
*H10D 84/85* (2025.01)

(52) U.S. Cl.
CPC ....... *H10D 30/6757* (2025.01); *H10D 84/853* (2025.01)

(56) References Cited

U.S. PATENT DOCUMENTS

| | | |
|---|---|---|
| 2022/0037528 A1 | 2/2022 | Chuang |
| 2022/0216340 A1 | 7/2022 | Lin |
| 2023/0163127 A1* | 5/2023 | Wu ..................... H10D 84/038 257/351 |
| 2023/0352529 A1* | 11/2023 | Jo ........................ H10D 62/121 |

* cited by examiner

SELF-ALIGNED PATTERNING LAYER FOR METAL GATE FORMATION

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as IC technologies progress towards smaller technology nodes, multi-gate devices have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. The channel region of an MBC transistor may be formed from nanowires, nanosheets, other nanostructures, and/or other suitable structures. The shapes of the channel region have also given an MBC transistor alternative names such as a nanosheet transistor or a nanowire transistor.

As the semiconductor industry further progresses into sub-10 nanometer (nm) technology process nodes in pursuit of higher device density, higher performance, and lower costs, challenges from both fabrication and design issues have led to stacked device structure configurations, such as complementary field effect transistors (C-FET) where an n-type multi-gate transistor and a p-type multi-gate transistor are stacked vertically, one over the other. The n-type multi-gate transistor and the p-type multi-gate transistor may require different work function metal layers. Selective formation of a type of work function layer without causing undesirable damages to surrounding structures may be challenging. Therefore, while existing gate formation processes for stacked devices are generally adequate for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
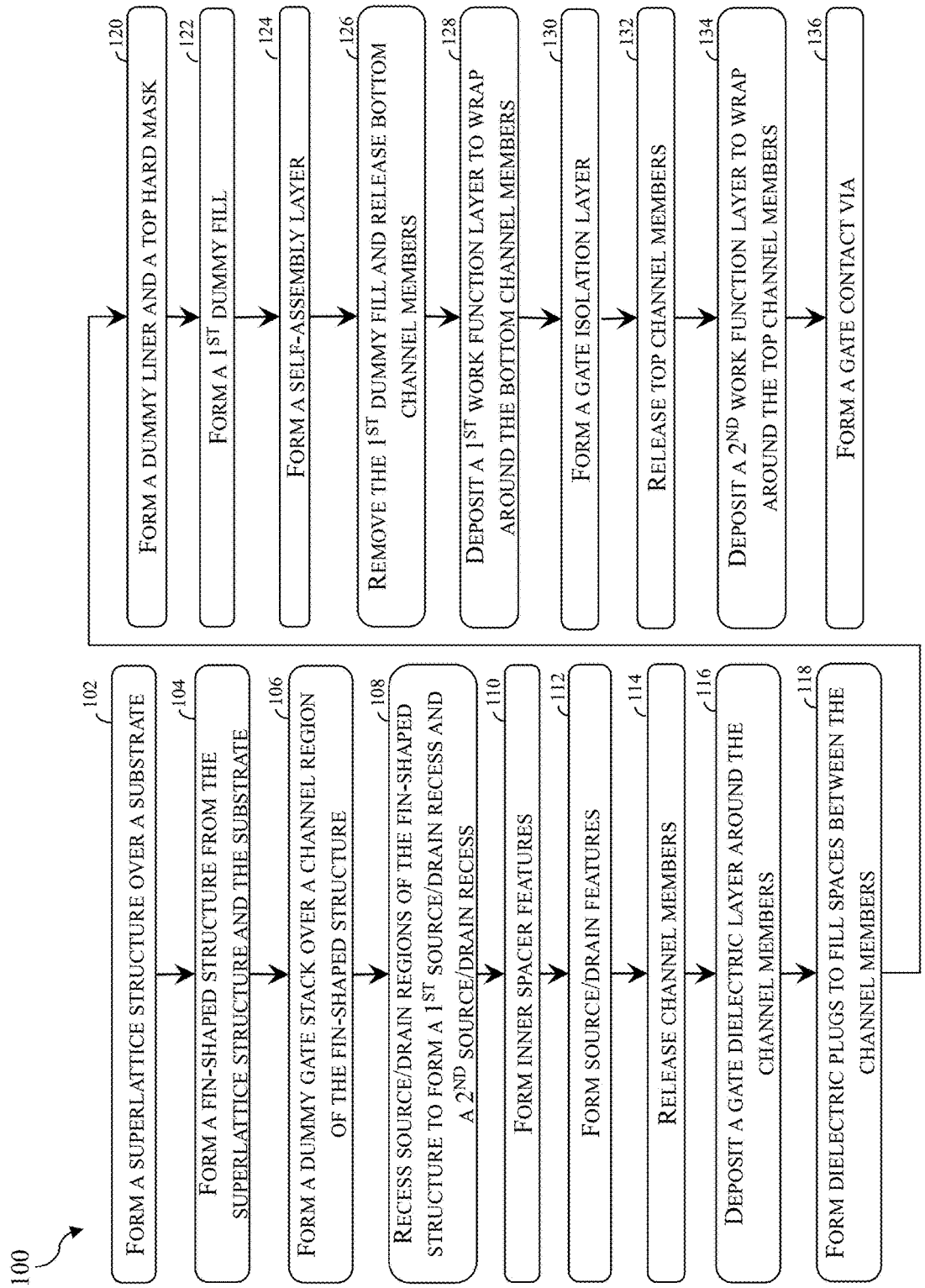
FIG. 1 illustrates a flow chart of a method 100 for forming a gate structure of a C-FET device, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art.

A stacked multi-gate device refers to a semiconductor device that includes a bottom multi-gate device and a top multi-gate device stacked over the bottom multi-gate device. When the bottom multi-gate device and the top multi-gate device are of different conductivity types, the stacked multi-gate device may be a complementary field effect transistor (C-FET). The multi-gate devices in a C-FET may be FinFETs or nanosheet/nanowire transistors. To optimize threshold voltages of the bottom multi-gate device and the top multi-gate device, different work function metal layers are deposited around a bottom active region of the bottom multi-gate device and a top active region of the top multi-gate device. It can be challenging to selectively depositing a first work function metal layer over the bottom active region while surfaces of the top active region are substantially free of the first work function metal layer.

The present disclosure provides methods for forming different work function metal layers to engage active regions of a stacked multi-gate device. In one example embodiment where the stacked multi-gate device includes nanosheet/nanowire transistors, a gate dielectric layer is deposited over surfaces of bottom channel members and top channel members. A first plurality of dielectric plug layers are formed to plug the space between the bottom channel members and a second plurality of dielectric plug layer are formed to plug the space between the top channel members. A titanium-containing dummy liner is formed over sidewalls of the bottom channel members, the first plurality of dielectric plug layers, the second plurality of dielectric plug layers, and the top channel members. A dummy fill layer is formed to cover the dummy liner over the bottom channel members. Then a self-assembled precursor is used to form a blocking layer over the dummy liner that is not covered by the dummy fill layer. The self-assembled precursor is configured to bind to titanium on the dummy liner such that the blocking layer is only formed on surfaces of the dummy liner. After selective removal of the dummy fill layer and the first plurality of dielectric plugs layers, the bottom channel members are released. With the blocking layer covering the dummy liner, a first work function metal layer is selectively deposited to wrap around the bottom channel members. The use of the blocking layer reduces or eliminates the needs to etch back excess first work function metal layer over the top channel members. Subsequently, a second work function metal layer is deposited to wrap around the top channel members.

The various aspects of the present disclosure will now be described in more detail with reference to the figures. In that regard, FIG. 1 is a flowchart illustrating method 100 for forming a semiconductor device according to various aspects of the present disclosure. Method 100 is merely an example and is not intended to limit the present disclosure to what is explicitly illustrated in method 100. Additional steps may be provided before, during and after method 100 and some steps described can be replaced, eliminated, or moved around for additional embodiments of the method. Not all steps are described herein in detail for reasons of simplicity. Method 100 is described below in conjunction with FIGS. 2-21, which are fragmentary cross-sectional views of a workpiece 200 at different stages of fabrication according to embodiments of method 100. Because the workpiece 200 will be fabricated into a semiconductor device 200 upon conclusion of the fabrication processes, the workpiece 200 may be referred to as the semiconductor device 200 as the context requires. Additionally, throughout the present application and across different embodiments, like reference numerals denote like features with similar structures and compositions, unless otherwise excepted. Source/drain region(s) may refer to a source or a drain, individually or collectively dependent upon the context.

Figure 2:
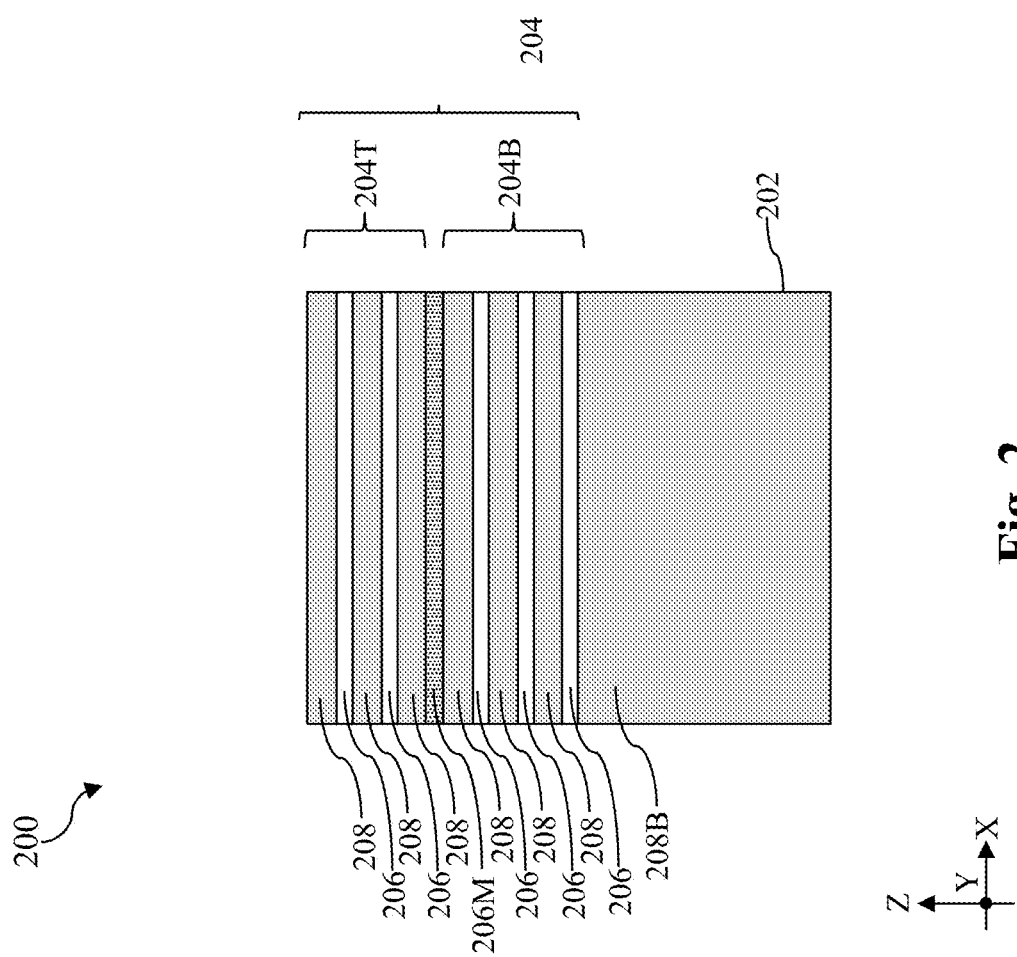
FIGS. 2-21 illustrate fragmentary cross-sectional views of a workpiece undergoing various fabrication processes in the method of FIG. 1, according to one or more aspects of the present disclosure.

Referring to FIGS. 1 and 2, method 100 includes a block 102 where a superlattice structure 204 is formed over a substrate 202. In one embodiment, the substrate 202 may be a silicon (Si) substrate. In some other embodiments, the substrate 202 may include other semiconductors such as germanium (Ge), silicon germanium (SiGe), or a III-V semiconductor material. Example III-V semiconductor materials may include gallium arsenide (GaAs), indium phosphide (InP), gallium phosphide (GaP), gallium nitride (GaN), gallium arsenide phosphide (GaAsP), aluminum indium arsenide (AlInAs), aluminum gallium arsenide (AlGaAs), gallium indium phosphide (GaInP), and indium gallium arsenide (InGaAs). The substrate 202 may also include a buried insulating layer, such as a buried silicon oxide layer, to have a silicon-on-insulator (SOI) structure. Although not explicitly shown in the figures, the substrate 202 may include an n-type well region and a p-type well region for fabrication of transistors of different conductivity types. When present, each of the n-type well and the p-type well is formed in the substrate 202 and includes a doping profile. An n-type well may include a doping profile of an n-type dopant, such as phosphorus (P) or arsenic (As). A p-type well may include a doping profile of a p-type dopant, such as boron (B). The doping in the n-type well and the p-type well may be formed using ion implantation or thermal diffusion and may be considered portions of the substrate 202. For ease of reference, the substrate 202 and structures formed thereon during the method 100 may be referred to as a workpiece 200.

The superlattice structure 204 includes a plurality of channel layers 208 interleaved by a plurality of sacrificial layers 206. The channel layers 208 and the sacrificial layers 206 may have different semiconductor compositions. In some implementations, the channel layers 208 are formed of silicon (Si) and sacrificial layers 206 are formed of silicon germanium (SiGe). In these implementations, the additional germanium content in the sacrificial layers 206 allow selective removal or recess of the sacrificial layers 206 without substantial damages to the channel layers 208. The sacrificial layers 206 and the channel layers 208 are deposited alternatingly, one-after-another, to form the superlattice structure 204.

The channel layers 208 in the bottom portion of the superlattice structure 204 will provide channel members of a bottom nanosheet/nanowire transistor, and the channel layers 208 in the top portion of the superlattice structure 204 will provide channel members of a top nanosheet/nanowire transistor. The term "channel member(s)" is used herein to designate any material portion for channel(s) in a transistor with nanoscale dimensions, and having an elongate shape, regardless of the cross-sectional shape of this portion. Channel members may come in forms of nanowires, nanosheet, or other nanostructures and may have cross-sections that are circular, oval, race-track shaped, rectangular, or square. For ease of references, the superlattice structure 204 may be vertically divided into a bottom portion 204B and a top portion 204T over the bottom portion 204B, with a middle sacrificial layer 206M sandwiched in between. The middle sacrificial layer 206M and the other sacrificial layers may have different germanium contents. In some embodiments, a germanium content of the middle sacrificial layer 206M may be greater than a germanium content of the other sacrificial layers 206 such that the entirety of the middle sacrificial layer 206M may be selectively removed during the formation of inner spacer recesses.

It is noted that the superlattice structure 204 in FIG. 2 includes six (6) layers of the channel layers 208 interleaved by six (6) layers of sacrificial layers 206 (including the middle sacrificial layer 206M), which is for illustrative purposes only and not intended to be limiting beyond what is specifically recited in the claims. It can be appreciated that any number of the channel layers 208 can be included in the superlattice structure 204 and distributed between the bottom portion and the top portion 204T. The number of layers depends on the desired number of channels members for the top nanosheet/nanowire transistor and the bottom nanosheet/nanowire transistor. In some embodiments, the number of the channel layers 208 in the superlattice structure 204 may be between 4 and 10. The thicknesses of the channel layers 208 and the sacrificial layers 206 may be selected based on device performance considerations of the bottom nanosheet/nanowire transistor, the top nanosheet/nanowire transistor, and the C-FET as a whole.

Figure 3:
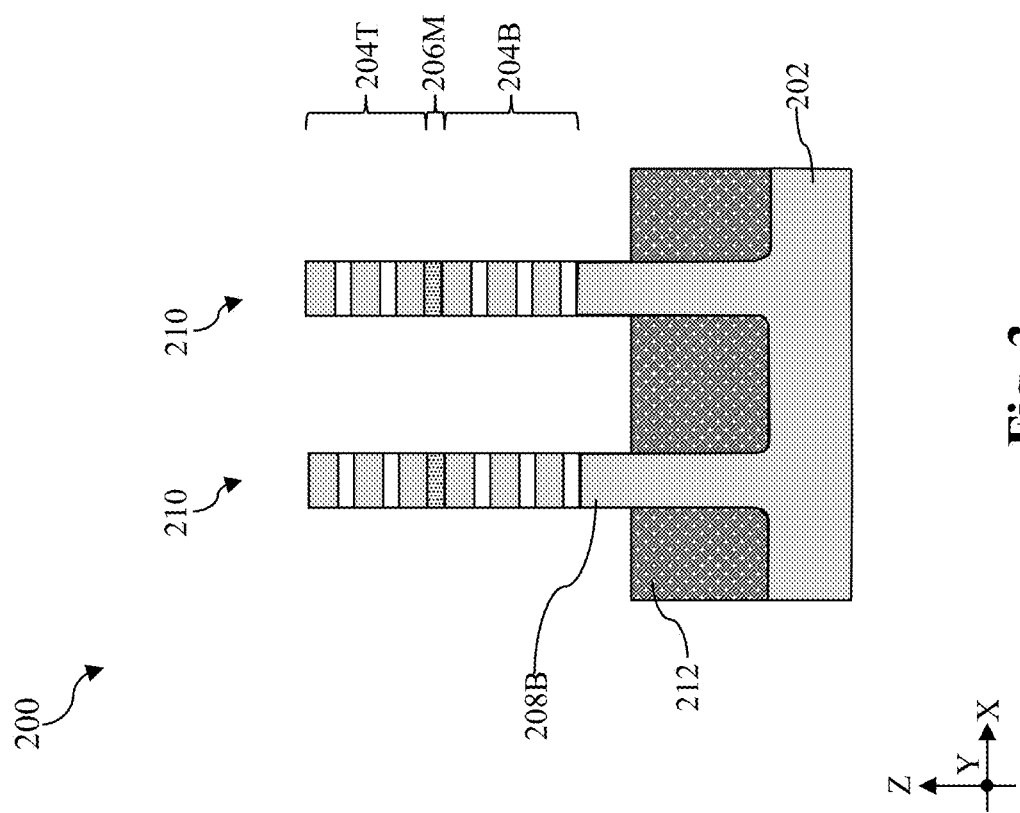

Referring to FIGS. 1 and 3, method 100 includes a block 104 where a fin-shaped structure 210 is formed from the superlattice structure 204 and a portion of the substrate 202. In some embodiments, the superlattice structure 204 and a portion of the substrate 202 are patterned to form the fin-shaped structure 210. For patterning purposes, a hard mask layer may be deposited over the superlattice structure 204. The hard mask layer may be a single layer or a multilayer. In one example, the hard mask layer includes a silicon oxide layer and a silicon nitride layer over the silicon oxide layer. As shown in FIG. 3, the fin-shaped structure 210 extends vertically along the Z direction from the substrate 202 and extends lengthwise along the Y direction. The fin-shaped structure 210 may be patterned using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a material layer is formed over a substrate and patterned using a photolithography process. Spacers are formed alongside the patterned material layer using a self-aligned process. The material layer is then removed, and the remaining spacers, or mandrels, may then be used as an etch mask to etch the superlattice structure 204 and the substrate 202 to form the fin-shaped structure 210. The etching process may include dry etching, wet etching, reactive ion etching (RIE), and/or other suitable processes.

While not explicitly shown in FIG. 3, after the fin-shaped structure 210 is formed, an isolation feature 212 is formed around the fin-shaped structure 210 to separate the fin-shaped structure 210 from an adjacent fin-shaped structure 210. The isolation feature 212 may also be referred to as a shallow trench isolation (STI) feature 212. In an example process, a dielectric material for the isolation feature is deposited over the workpiece 200, including the fin-shaped structure 210, using CVD, subatmospheric CVD (SACVD), flowable CVD (FCVD), spin-on coating, and/or other suitable process. Then the deposited dielectric material is planarized and recessed to form the isolation feature 212. As shown in FIG. 3, the fin-shaped structure rises above the isolation feature 212. The dielectric material for the isolation feature may include silicon oxide, silicon oxynitride, fluorine-doped silicate glass (FSG), a low-k dielectric, combinations thereof, and/or other suitable materials.

Figure 4:
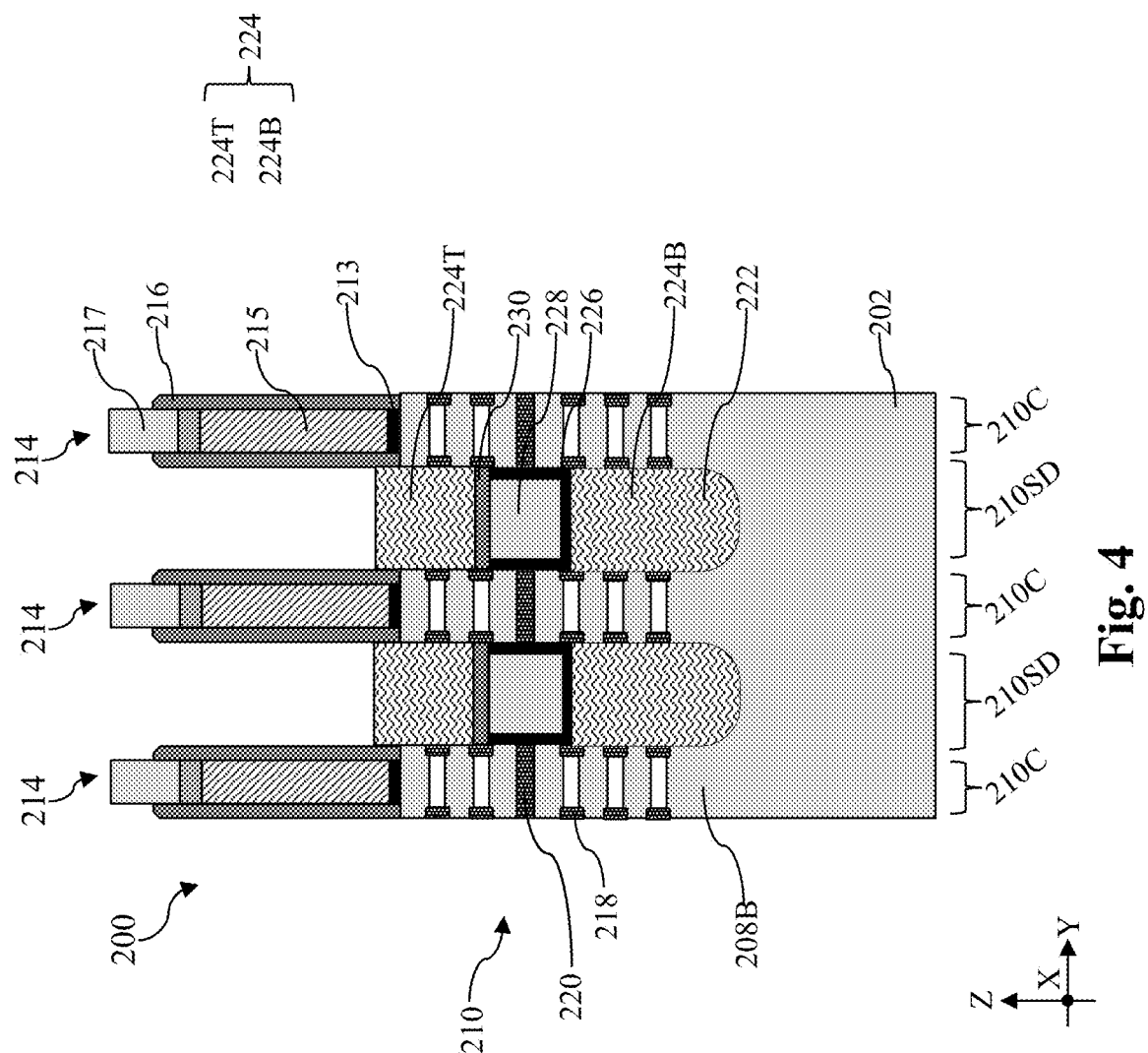

Referring to FIGS. 1 and 4, method 100 includes a block 106 where a dummy gate stack 214 is formed over a channel regions 210C of the fin-shaped structure 210. In some embodiments, a gate replacement process (or gate-last process) is adopted where the dummy gate stack 214 serves as a placeholder for a functional gate structure. Other processes and configuration are possible. To form the dummy gate stack 214, a dummy dielectric layer 213, a dummy gate electrode layer 215, and a gate-top hard mask layer 217 are deposited over the workpiece 200. The deposition of these layers may include use of low-pressure CVD (LPCVD), CVD, plasma-enhanced CVD (PECVD), PVD, ALD, thermal oxidation, e-beam evaporation, or other suitable deposition techniques, or combinations thereof. The dummy dielectric layer 213 may include silicon oxide, the dummy gate electrode layer 215 may include polysilicon, and the gate-top hard mask layer 217 may be a multi-layer that includes silicon oxide and silicon nitride. Using photolithography and etching processes, the gate-top hard mask layer 217 is patterned. The photolithography process may include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. The etching process may include dry etching (e.g., RIE etching), wet etching, and/or other etching methods. Like the fin-shaped structures 210, the dummy gate stack 214 may also be patterned using double-patterning or multiple-patterning techniques. Thereafter, using the patterned gate-top hard mask 217 as the etch mask, the dummy dielectric layer 213 and the dummy gate electrode layer 215 are then etched to form the dummy gate stack 214. The dummy gate stack 214 extends lengthwise along the X direction to wrap over the fin-shaped structure 210 and lands on the isolation feature 212. The portion of the fin-shaped structure 210 underlying the dummy gate stack 214 defines a channel region 210C. The channel region 210C and the dummy gate stack 214 also define source/drain regions 210SD that are not vertically overlapped by the dummy gate stack 214. The channel region 210C is disposed between two source/drain regions 210SD along the Y direction.

Referring to FIGS. 1 and 4, method 100 includes a block 108 where source/drain regions 210SD of the fin-shaped structure 210 are recessed to form source/drain recesses. Operations at block 108 may include formation of at least one gate spacer layer 216 over the sidewalls of the dummy gate stack 214 before the source/drain regions 210SD are recessed. In some embodiments, the formation of the at least one gate spacer layer 216 includes deposition of one or more dielectric layers over the workpiece 200. In an example process, the one or more dielectric layers are conformally deposited using CVD, SACVD, or ALD. The one or more dielectric layers may include silicon oxide, silicon nitride, silicon carbide, silicon oxynitride, silicon carbonitride, silicon oxycarbide, silicon oxycarbonitride, and/or combinations thereof. After the deposition of the at least one gate spacer layer 216, the workpiece 200 is etched in an anisotropic etch process to form the source/drain recesses over the source/drain regions 210SD. The etch process at block 108 may be a dry etch process or a suitable etch process. An example dry etch process may implement an oxygen-containing gas, hydrogen, a fluorine-containing gas (e.g., $CF_4$, $SF_6$, $NF_3$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. Sidewalls of the sacrificial layers 206 and the channel layers 208 in the channel regions 210C are exposed in the source/drain recesses.

Referring to FIGS. 1 and 4, method 100 includes a block 110 where inner spacer features 218 are formed. At block 110, the sacrificial layers 206 exposed in the source/drain recesses are selectively and partially recessed to form inner spacer recesses, while the exposed channel layers 208 are substantially unetched. The middle sacrificial layer 206M, due to its greater germanium content, may be completely removed during the formation of inner spacer recesses. In an embodiment where the channel layers 208 consist essentially of silicon (Si) and sacrificial layers 206 consist essentially of silicon germanium (SiGe), the selective and partial recess of the sacrificial layers 206 may include a SiGe oxidation process followed by a SiGe oxide removal. In that embodiments, the SiGe oxidation process may include use of ozone ($O_3$). In some other embodiments, the selective recess may be a selective isotropic etching process (e.g., a selective dry etching process or a selective wet etching process), and the extent at which the sacrificial layers 206 are recessed is controlled by duration of the etching process. The selective dry etching process may include use of one or more fluorine-based etchants, such as fluorine gas or hydrofluorocarbons. The selective wet etching process may include use of hydrogen fluoride (HF) or ammonium hydroxide ($NH_4OH$). After the formation of the inner spacer recesses, an inner spacer material layer is deposited over the workpiece 200, including in the inner spacer recesses. Additionally, as shown in FIG. 4, the inner spacer material layer may also be deposited in the space left behind by selective removal of the middle sacrificial layer 206M. The inner spacer material layer may include silicon oxide, silicon nitride, silicon oxycarbide, silicon oxycarbonitride, silicon carbonitride, metal nitride, or a suitable dielectric material. The deposited inner spacer material layer is then etched back to remove excess inner spacer material layer over the gate spacer layer and sidewalls of the channel layers 208, thereby forming the inner spacer features 218 and the middle dielectric layer 220 as shown in FIG. 4. In some embodiments, the etch back process at block 110 may be a dry etch process that includes use of an oxygen-containing gas, hydrogen, nitrogen, a fluorine-containing gas (e.g., $NF_3$, $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas (e.g., $CF_3I$), other suitable gases and/or plasmas, and/or combinations thereof.

Referring to FIGS. 1 and 4, method 100 includes a block 112 where source/drain features 224 are formed over the source/drain regions 210SD. Operations at block 112 may include deposition of bottom source/drain features 224B, deposition of a bottom contact etch stop layer (CESL) 226 and a bottom interlayer dielectric (ILD) layer 228, deposition of an etch stop layer (ESL) over the bottom CESL 226 and the bottom ILD layer 228, deposition of top source/drain features 224T, deposition of a top CESL and a top ILD layer. For ease of reference, the bottom source/drain features 224B and the top source/drain features 224T may be collectively referred to as source/drain features 224.

The bottom source/drain features 224B are formed over the source/drain regions 210SD. Before the deposition of the bottom source/drain features 224B, a sidewall blocking layer (not shown) may be deposited over the workpiece 200 to cover sidewalls of the channel layers 208 formed from the top portion 204T of the superlattice structure 204. The sidewall blocking layer is formed of a dielectric material, such as silicon oxide or silicon nitride such that it blocks epitaxial formation on sidewalls of the channel layers 208. Without the sidewall blocking layer, the epitaxial growth from the top channel layers 208 may merge to block satisfactory formation of the bottom source/drain features 224B. After the formation of the sidewall blocking layer, the bottom source/drain features 224B may be formed using an epitaxial process, such as VPE, UHV-CVD, MBE, and/or other suitable processes. The epitaxial growth process may use gaseous and/or liquid precursors, which interact with the composition of the substrate 202 as well as the channel layers 208. The sidewall blocking layer, due to its dielectric composition, blocks formation of the bottom source/drain features 224B on sidewalls of the channel layers 208 formed from the top portion 204T of the superlattice structure 204. As illustrated in FIG. 4, the deposited bottom source/drain features 224B are in physical contact with (or adjoining) the channel layers 208 formed from the bottom portion 204B of the superlattice structure 204. Depending on the design, the bottom source/drain features 224B may be n-type or p-type. In the depicted embodiments, the bottom source/drain features 224B are p-type source/drain features and may include silicon germanium (SiGe) doped with a p-type dopant, such as boron (B). In these depicted embodiments, the bottom source/drain features 224B may include boron doped silicon germanium (SiGe:B).

Referring still to FIG. 4, the bottom CESL 226 and the bottom ILD layer 228 are deposited over the bottom source/drain features 224B. The bottom CESL 226 may include silicon nitride, silicon oxynitride, and/or other materials known in the art and may be formed by CVD, ALD, plasma-enhanced chemical vapor deposition (PECVD) process and/or other suitable deposition or oxidation processes. In some embodiments, the bottom CESL 226 is first conformally deposited on the workpiece 200 and then the bottom ILD layer 228 is deposited over the bottom CESL 226 by spin-on coating, FCVD, CVD, or other suitable deposition technique. The bottom ILD layer 228 may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. In some embodiments, after formation of the bottom ILD layer 228, the workpiece 200 may be annealed to improve integrity of the bottom ILD layer 228. The bottom CESL 226 and the bottom ILD layer 228 are etched back to exposed sidewalls of the top channel layers 208 formed from the top portion 204T of the superlattice structure 204. It is noted that the blocking layer may also be removed during the etch back of the bottom CESL 226 and the bottom ILD layer 228.

The etch stop layer (ESL) 230 is then deposited over the bottom CESL 226 and the bottom ILD layer 228. The ESL 230 may include silicon nitride or silicon oxynitride and is in direct contact with top surfaces of the bottom CESL 226 and the bottom ILD layer 228. The ESL 230 may be deposited using ALD, CVD, or a suitable method. An etch back may be performed using a dry etchant or a wet etchant to expose sidewalls of the top channel layers 208 formed from the top portion 204T of the superlattice structure 204. The bottom ILD layer 228 and the bottom CESL 226 provide a planar top surface. The ESL 230 is deposited on the planar top surface. As shown in FIG. 4, the ESL 230 may be in direct contact with at least one of the inner spacer features 218.

The top source/drain features 224T are formed over the ESL 230. The top source/drain features 224T may be formed using an epitaxial process, such as VPE, UHV-CVD, MBE, and/or other suitable processes. The epitaxial growth process may use gaseous and/or liquid precursors, which interact with composition of the top channel layers 208 formed from the top portion 204T of the superlattice structure 204. The epitaxial growth of top source/drain features 224T may take place from the exposed sidewalls of the top channel layers 208. The deposited top source/drain features 224 are in physical contact with (or adjoining) the channel layers 208 formed from the top portion 204T of the superlattice structure 204. Depending on the design, the top source/drain features 224T may be n-type or p-type. In the depicted embodiments, the top source/drain features 224T are n-type source/drain features and may include silicon (Si) doped with an n-type dopant, such as phosphorus (P). In these depicted embodiments, the top source/drain features 224T may include phosphorus doped silicon (Si:P).

While not explicitly shown in the figures, the top CESL and the top ILD layer are deposited over the top source/drain features 224T. The top CESL is similar to the bottom CESL 226. It may include silicon nitride, silicon oxynitride, and/or other materials known in the art and may be formed by CVD. ALD, plasma-enhanced chemical vapor deposition (PECVD) process and/or other suitable deposition or oxidation processes. The top ILD layer is deposited on the top CESL. The top ILD layer is similar to the bottom ILD layer 228. It may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. In some embodiments, after formation of the top ILD layer, the workpiece 200 may be annealed to improve integrity of the top ILD layer. To remove excess materials and to expose top surfaces of the dummy gate stacks 214, a planarization process, such a chemical mechanical polishing (CMP) process may be performed.

Figure 5:
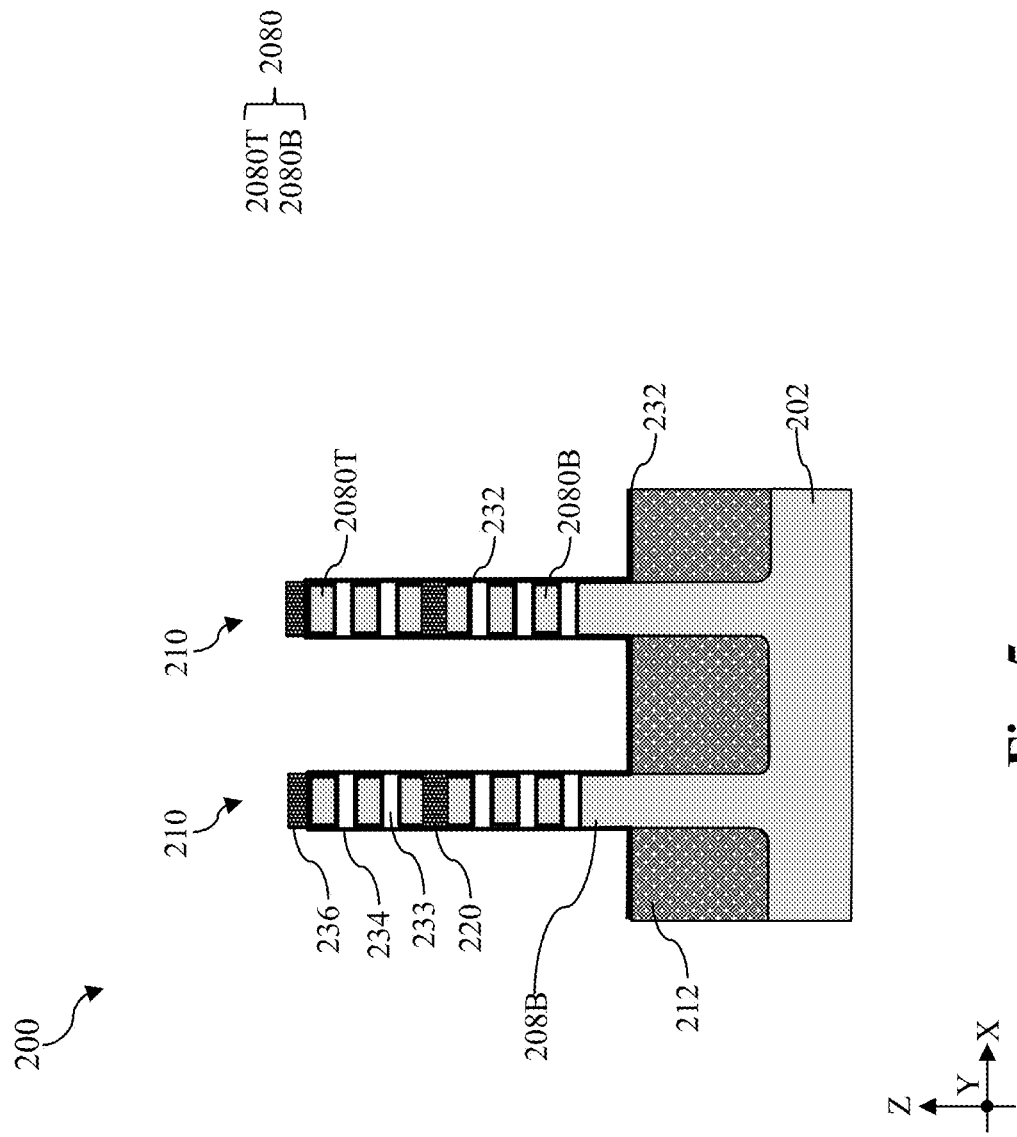

Referring to FIGS. 1 and 5, method 100 includes a block 114 where the channel members 2080 are released. Operations at block 114 may include removal of the dummy gate stacks 214 and release of the channel layers 208 as channel members 2080. The removal of the dummy gate stacks 214 may include one or more etching processes that are selective to the material in the dummy gate stacks 214. For example, the removal of the dummy gate stacks 214 may be performed using as a selective wet etch, a selective dry etch, or a combination thereof. After the removal of the dummy gate stacks 214, sidewalls of the channel layers 208 and sacrificial layers 206 in the channel regions 210C (shown in FIG. 4) are exposed. Thereafter, the sacrificial layers 206 in the channel regions 210C are selectively removed to release the channel layers 208 as the channel members 2080. As shown in FIG. 5, the channel members 2080 includes bottom channel members 2080B below the middle dielectric layer 220 and top channel members 2080T over the middle dielectric layer 220. Here, because the dimensions of the channel members 2080 are nanoscale, the channel members 2080 may also be referred to as nanostructures. The selective removal of the sacrificial layers 206 may be implemented by selective dry etch, selective wet etch, or other selective etch processes. In some embodiments, the selective wet etching includes an APM etch (e.g., ammonium hydroxide-hydrogen peroxide-water mixture). In some other embodiments, the selective removal includes SiGe oxidation followed by a silicon germanium oxide removal. For example, the oxidation may be provided by ozone clean and then silicon germanium oxide may be removed by an etchant such as $NH_4OH$.

Referring to FIGS. 1 and 5, method 100 includes a block 116 where a gate dielectric layer 232 is deposited to wrap around the channel members 2080. While not explicitly shown in the figures, an interfacial layer is first formed over exposed surfaces of the channel members 2080 and substrate 202 before the deposition of the gate dielectric layer 232. That is, the interfacial layer is present at the interfaces between the gate dielectric layer 232 and the channel members 2080 as well as between the gate dielectric layer 232 and the substrate 202. In some embodiments, the interfacial layer includes silicon oxide and may be formed in a pre-clean process. An example pre-clean process may include use of RCA SC-1 (ammonia, hydrogen peroxide and water) and/or RCA SC-2 (hydrochloric acid, hydrogen peroxide and water). The gate dielectric layer 232 is then deposited over the interfacial layer using ALD, CVD, and/or other suitable methods. The gate dielectric layer 232 is formed of high-K dielectric materials. As used and described herein, high-k dielectric materials include those having a high dielectric constant, for example, greater than that of thermal silicon oxide (~3.9). The gate dielectric layer 232 may include hafnium oxide. Alternatively, the gate dielectric layer 232 may include other high-K dielectrics, such as titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), (Ba,Sr)$TiO_3$ (BST), silicon nitride (SiN), silicon oxynitride (SiON), combinations thereof, or other suitable material. It is noted that because the middle dielectric layer 220 is in contact with a top surface of the topmost bottom channel member 2080B and a bottom surface of the bottommost top channel member 2080T, the interfacial layer and the gate dielectric layer 232 do not extend along the top surface of the topmost bottom channel member 2080B and the bottom surface of the bottommost top channel member 2080T. As shown in FIG. 5, the gate dielectric layer 232 is also deposited on sidewalls of the fin-shaped structure and on a top surface of the isolation feature 212. In some embodiments not explicitly shown in the figures, a silicon (Si) cap layer may be deposited over the gate dielectric layer 232 to enlarge the process window and the protect the gate dielectric layer 232.

Referring to FIGS. 1 and 5, method 100 includes a block 118 where dielectric plugs 233 are formed to fill the spaces among channel members 2080. To enable easy and complete removal of any dummy fill materials, spaces among the channel members 2080 are filled with dielectric plugs 233. The dielectric plugs 233 are formed with a material that can be selectively removed without substantially damaging the gate dielectric layer 232. In some embodiments, the dielectric plugs 233 include aluminum oxide that may be selectively removed using ammonium hydroxide ($NH_4OH$) or hydrofluoric acid (HF). To form the dielectric plugs 233, an aluminum oxide layer is deposited over the workpiece 200 to fill the spaces between the channel members 2080. Then an anisotropic etch process is performed to remove excess aluminum oxide outside the spaces between the channel members 2080. The anisotropic etch process may be a dry etch process that includes use of an oxygen-containing gas, hydrogen, nitrogen, a fluorine-containing gas (e.g., $NF_3$, $CF_4$, $SF_6$, $CH_2F_2$, $CHF_3$, and/or $C_2F_6$), a chlorine-containing gas (e.g., $Cl_2$. $CHCl_3$, $CCl_4$, and/or $BCl_3$), a bromine-containing gas (e.g., HBr and/or $CHBr_3$), an iodine-containing gas (e.g., $CF_3I$), other suitable gases and/or plasmas, and/or combinations thereof.

Referring to FIGS. 1 and 5, method 100 includes a block 120 where a dummy liner 234 is formed along sidewalls of the channel members 2080 and the dielectric plugs 233 and a top hard mask 236 is formed over a top surface of the dummy liner 234. The dummy liner 234 functions to protect the channel members 2080 from being damaged during the subsequent operations leading to the formation of the gate structures. To introduce etching selectivity, the dummy liner 234 includes a metal nitride, such as titanium nitride (TiN) or tantalum nitride (TaN). In the depicted embodiment, the dummy liner 234 includes titanium nitride (TiN) and may be referred to as a titanium-containing liner 234. The dummy liner 234 may be deposited using ALD and as shown in FIG. 5, is deposited on the gate dielectric layer 232 along sidewalls of the channel members 2080 and on sidewalls of the dielectric plugs 233. The dummy liner 234 is also deposited on the gate dielectric layer 232 that is disposed on sidewalls of the fin-shaped structure 210 and on a top surface of the isolation feature 212. That is, the dummy liner 234 is spaced apart from the bottom silicon layer 208B and the isolation feature 212 by the gate dielectric layer 232. Additionally, the dummy liner 234 is also deposited on the gate dielectric layer 232 disposed on a topmost top channel member 2080T.

After the deposition of the dummy liner 234, the top hard mask 236 is formed on the dummy liner 234 disposed over the channel members 2080. In some embodiments, the top hard mask 236 includes silicon nitride. In an example process to form the top hard mask 236, a bottom antireflective coating (BARC) layer is deposited over the workpiece 200 to fill the spaces among fin-shaped structures. A planarization process is then performed to expose a top surface of the dummy liner 234 disposed along a top surface of the topmost top channel member 208T. A hard mask layer is then deposited on the BARC layer and patterned to form the top hard mask 236 over the channel members 2080. After the patterning of the hard mask layer, the BARC layer is removed by ashing.

Figure 6:
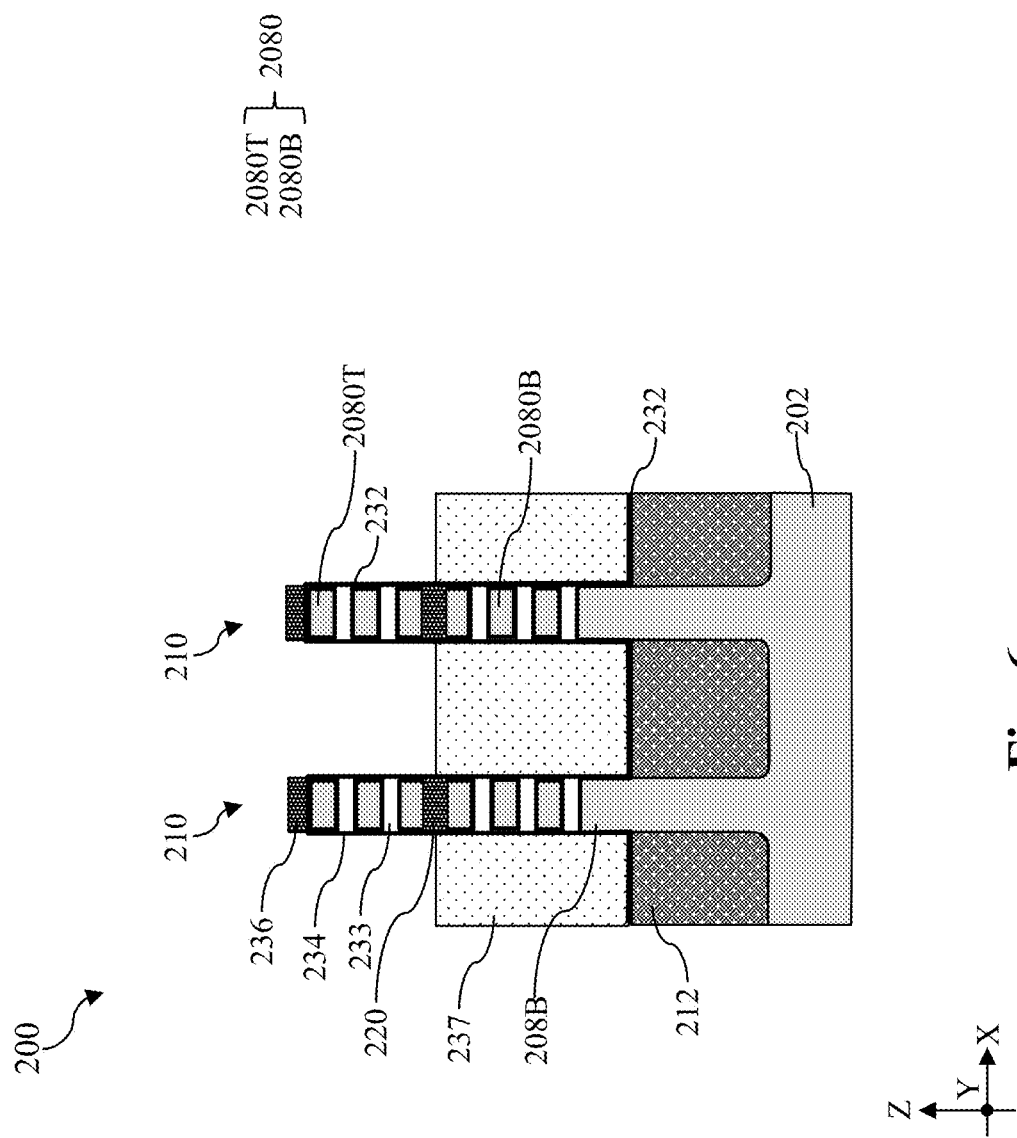

Referring to FIGS. 1 and 6, method 100 includes a block 122 where a first dummy fill 237 is formed to cover the bottom channel members 2080B. In some embodiments, the first dummy fill 237 may include silicon oxide and may be deposited using flowable CVD (FCVD). To improve integrity of the first dummy fill 237, operations at block 122 may include an anneal process at a temperature between about 350° C. and about 500° C.

Figure 7:
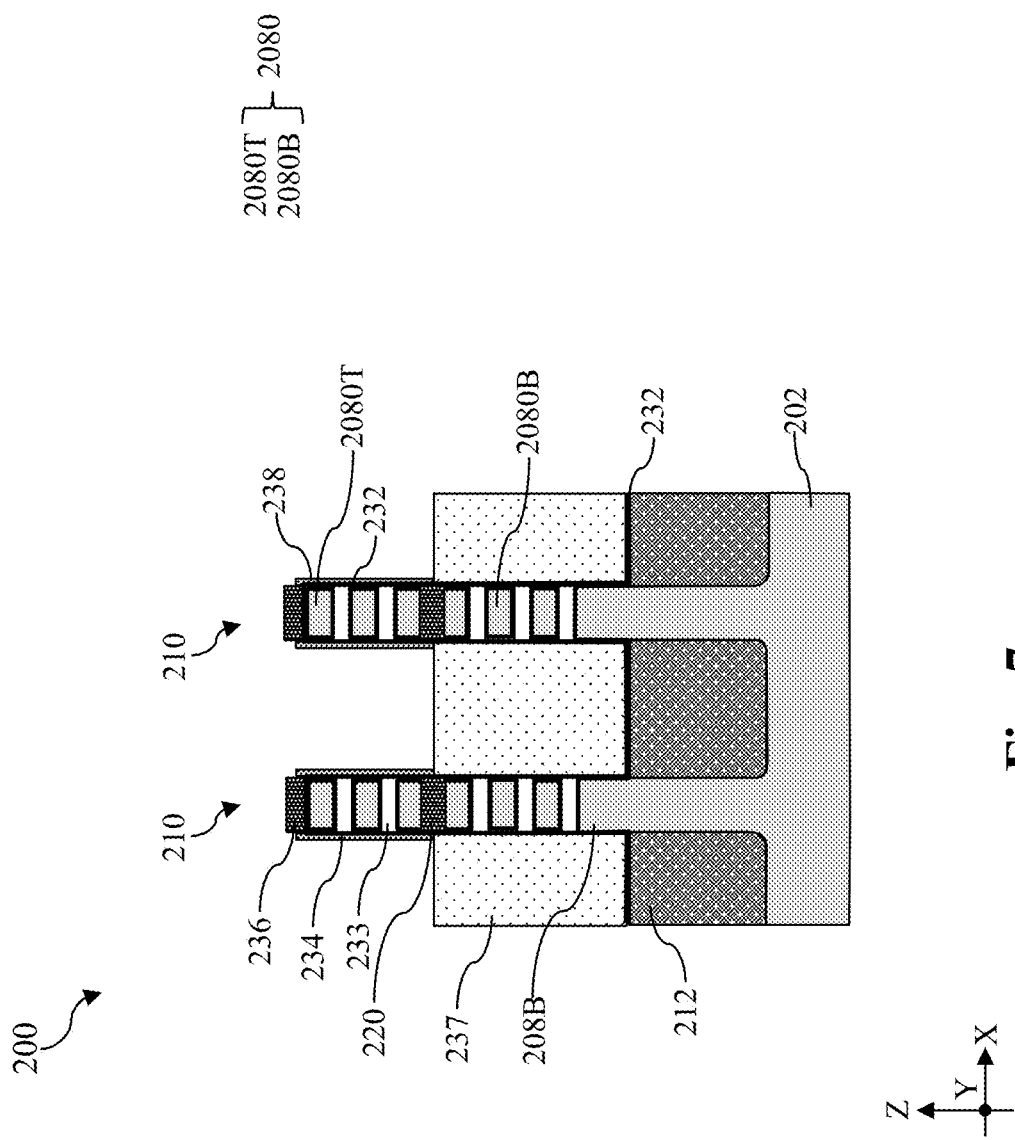
Figure 22:
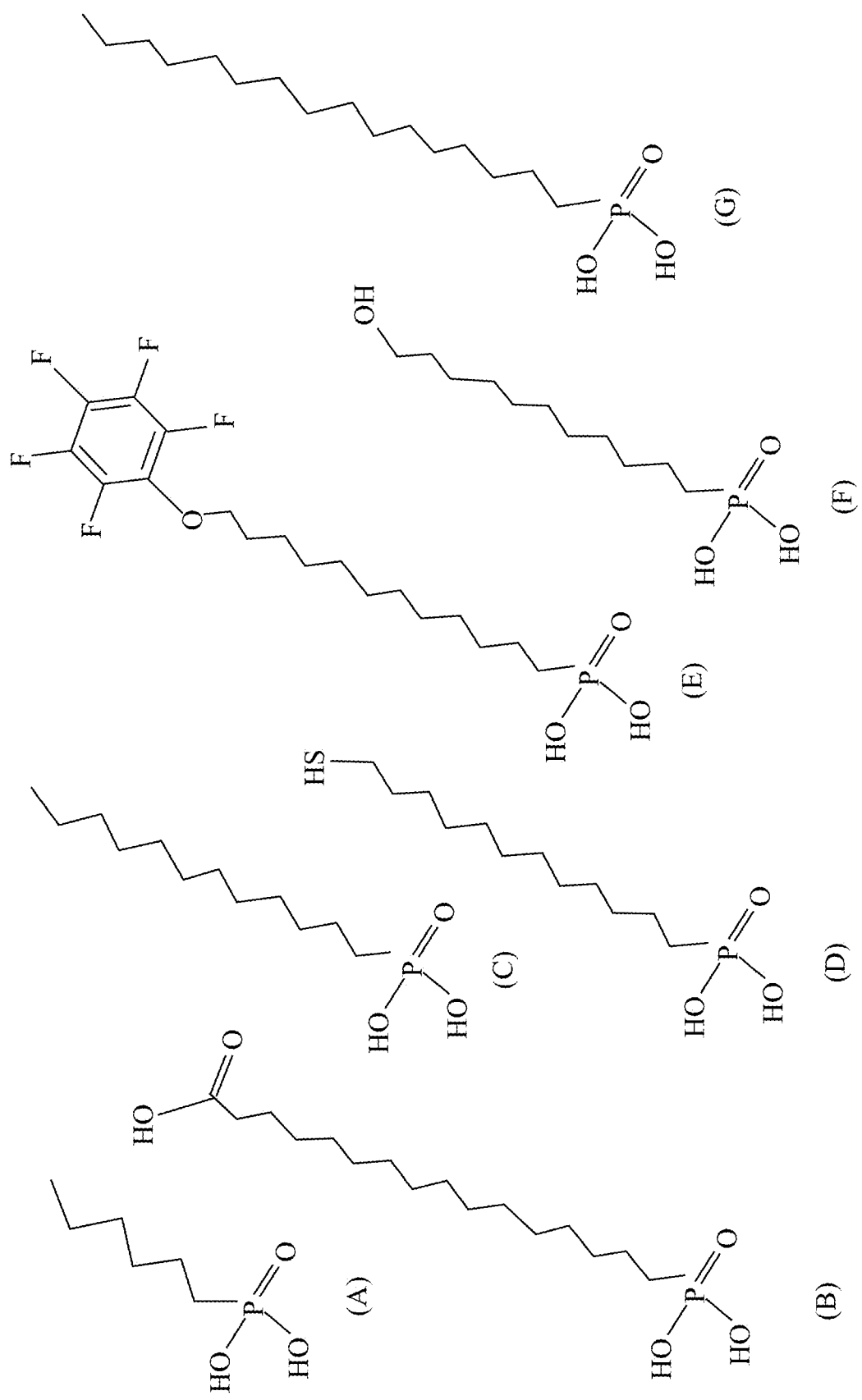
FIG. 22 illustrates example self-assembly precursors that may be used with the method 100 in FIG. 1, according to one or more aspects of the present disclosure.
Figure 23:
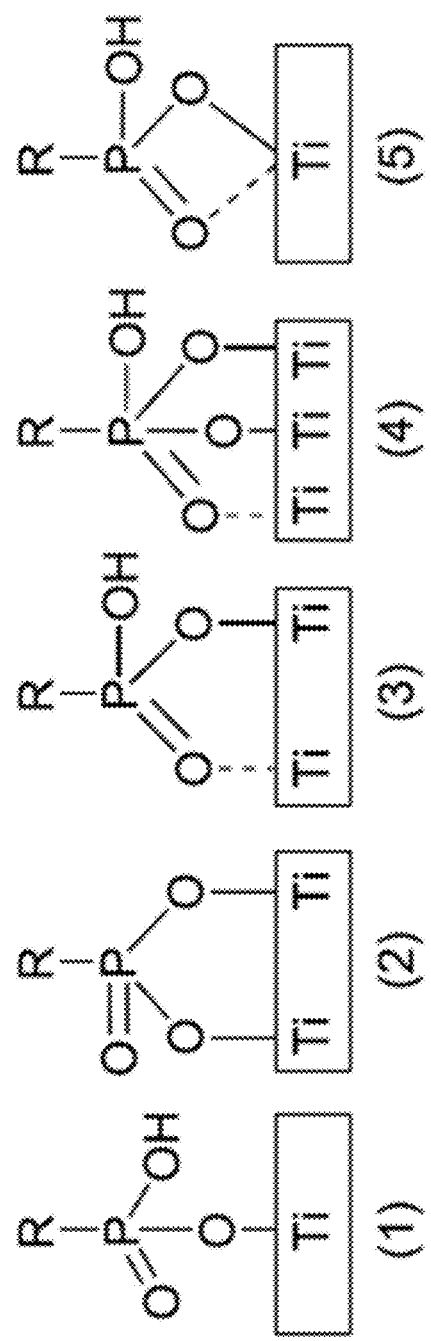
FIG. 23 schematically illustrates mechanisms for a self-assembly precursor to bind to a titanium-containing surface, according to one or more aspects of the present disclosure.

Referring to FIGS. 1 and 7, method 100 includes a block 124 where a blocking layer 238 is formed on the dummy liner 234 along sidewalls of the top channel members 2080T. With the first dummy fill 237 covering the bottom channel members 2080B, the blocking layer 238 is selectively formed on the dummy liner 234. In some embodiments, blocking layer 238 may be a self-assembled monolayers (SAM) that is deposited by ALD using titanium binding precursors. A molecule of the titanium binding precursor may include a head group to bind to titanium in the titanium-containing liner 234 and a hydrocarbon tail group. Reference is now made to FIG. 22. Example titanium binding precursors include hexylphosphonic acid (HPA) ((A) in FIG. 22), dodecylphosphonic acid (DDPA) ((C) in FIG. 22), octadecylphosphonic acid (ODPA) ((G) in FIG. 22), 16-phosphonohexadecanoic acid (PHDA) ((B) in FIG. 22), 12-mercaptododecylphosphonic acid (MDPA) ((D) in FIG. 22), 12-pentafluorophenoxydodecylphosphonic acid (PFPA) ((E) in FIG. 22), and 11-hydroxyundecylphosphonic acid (HUPA) ((F) in FIG. 22). Each of these examples include a phosphonic acid moiety. Reference is now made to FIG. 23. A phosphonic acid moiety has several binding modes and titanium on the dummy liner 234. For example, phosphonic acid moiety may have a monodentate binding ((1) in FIG. 23) with a single titanium atom, a bridging bidentate binding ((2) or (3) in FIG. 23) with two titanium atoms, a bridging tridentate binding with three titanium atoms ((4) in FIG. 23), and a chelating bidentate ((5) in FIG. 23) with a single titanium atom. As shown in FIG. 7, the blocking layer 238 is selectively deposited along exposed sidewalls of the dummy liner 234 that extends along sidewalls of the top channel members 2080T. In some implementations, a thickness of the blocking layer 238 may be between about 4.5 Å and about 30 Å.

Figure 8:
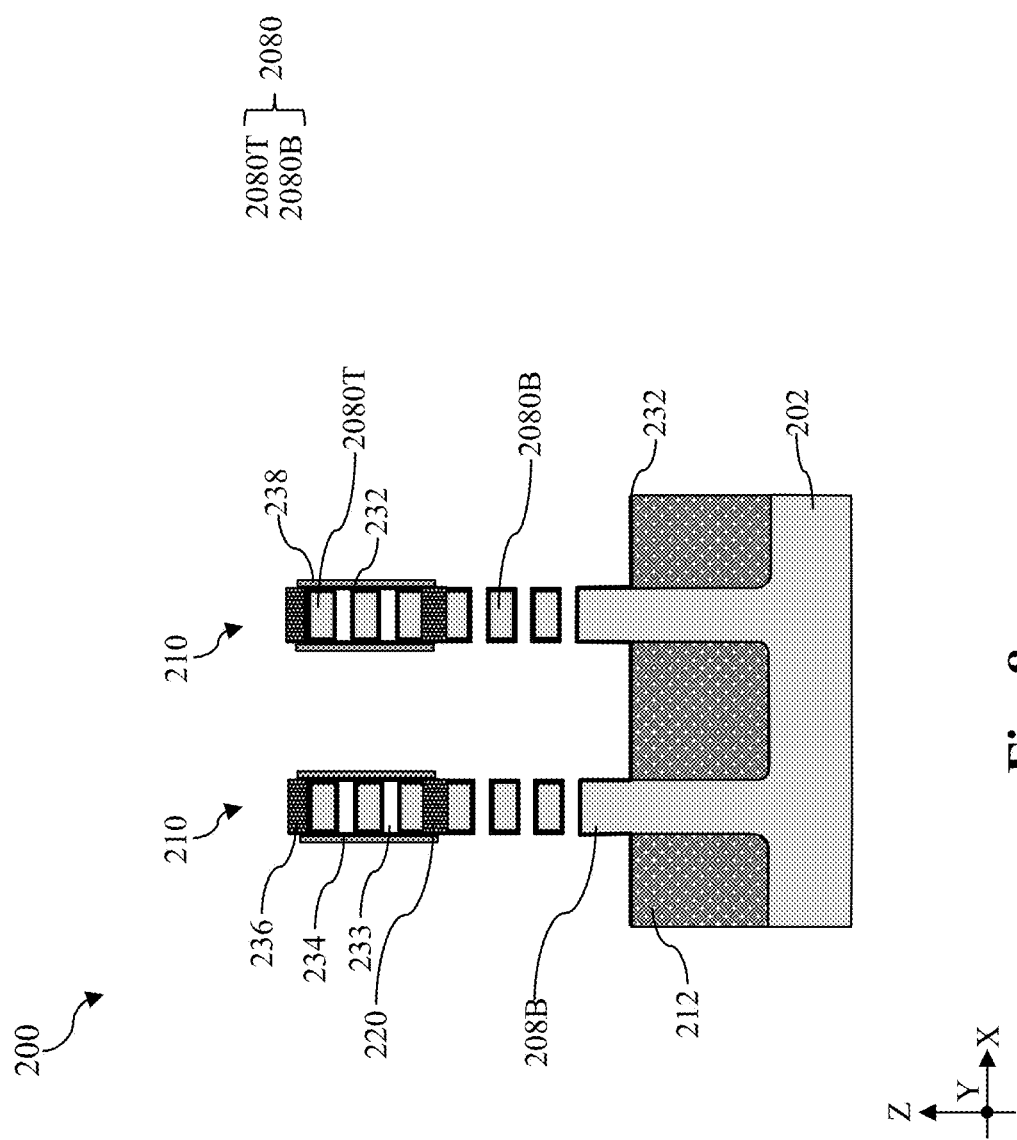

Referring to FIGS. 1 and 8, method 100 includes a block 126 wherein the first dummy fill 237 is removed to release the bottom channel members 2080B. Operations at block 126 includes selectively removal of the first dummy fill 237 and the selective removal of the dielectric plugs 233 that are not covered by the blocking layer 238. In some embodiments, the first dummy fill 237 is removed using a dry etch process that uses fluorine-containing gases ($F_2$, $NF_3$, $CF_4$, $SF_6$, $CH_2F_2$, $CHF_3$, and/or $C_2F_6$) or a mixture thereof. The dielectric plugs 233 may be removed using an aqueous solution of ammonium hydroxide or hydrofluoric acid (HF) or dilute HF. In some alternative embodiments, with the blocking layer 238 in place, the first dummy fill 237 may be etched away using hydrofluoric acid (HF) or dilute HF. In one embodiment, both the dielectric plugs 233 and the first dummy fill 237 may be selectively removed using hydrofluoric acid (HF) or dilute HF. With the removal of the first dummy fill 237 and the dielectric plugs 233, the bottom channel members 2080B are released again.

Figure 9:
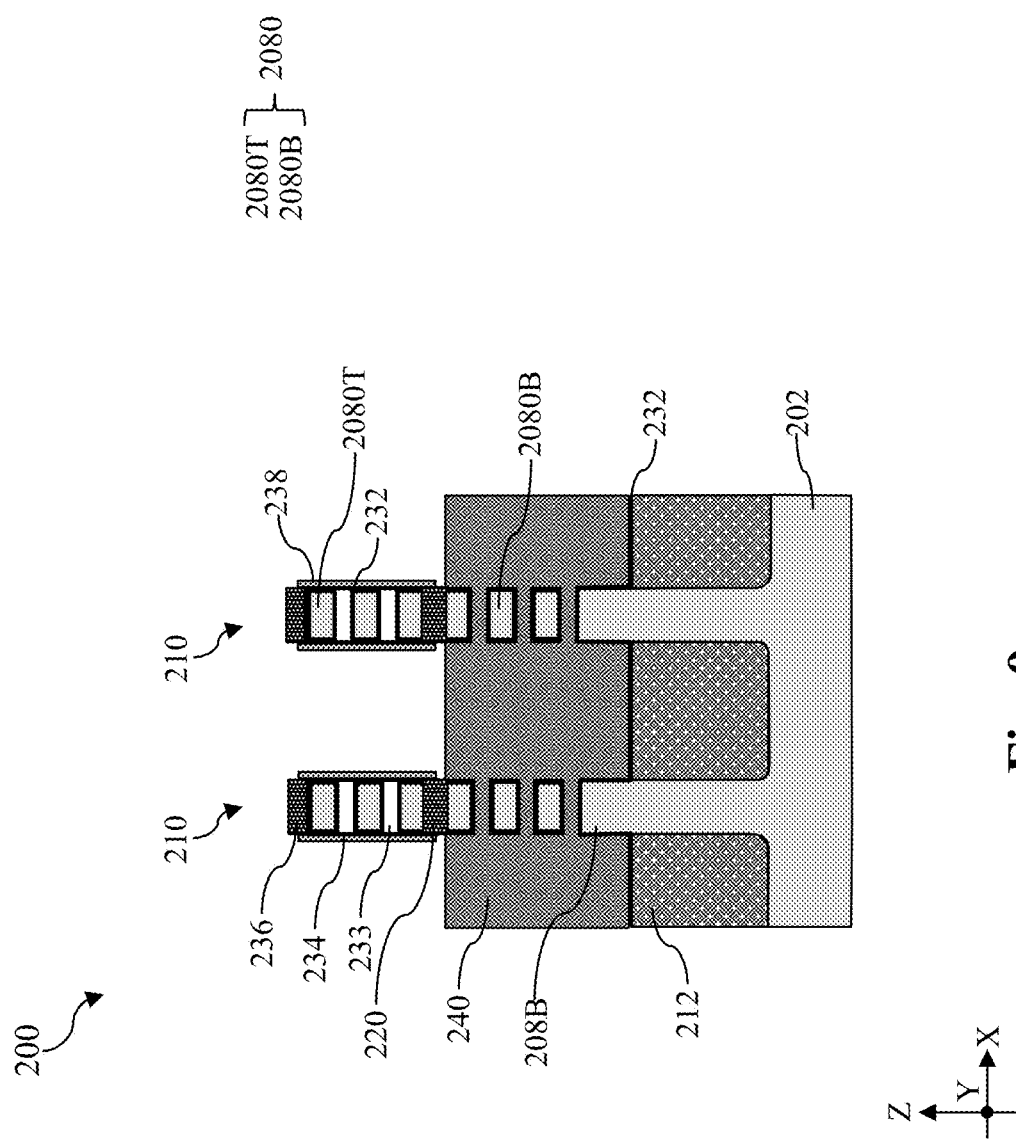

Referring to FIGS. 1 and 9, method 100 includes a block 128 wherein a first work function layer 240 is deposited to wrap around each of the bottom channel members 2080B. With the bottom channel members 2080B released, the first work function layer 240 is deposited to wrap around each of the bottom channel members 2080B. Depending on the design of the semiconductor device, the first work function layer 240 may be an n-type work function layer or a p-type work function layer. The first work function layer 240 may include a single layer or alternatively a multi-layer structure, such as various combinations of a metal layer with a selected work function to enhance the device performance. In the depicted embodiments, the first work function layer 240 is a p-type work function layer and may include titanium nitride (TiN), tantalum nitride (TaN), ruthenium (Ru), molybdenum (Mo), aluminum (Al), tungsten nitride (WN), zirconium silicide ($ZrSi_2$), molybdenum silicide ($MoSi_2$), tantalum silicide ($TaSi_2$), nickel silicide ($NiSi_2$), other p-type work function material, or combinations thereof. In one embodiment, the first work function layer 240 includes titanium nitride (TiN). The first work function layer 240 may be deposited using ALD. It is observed that the tail groups of the blocking layer 238 hinders deposition of the first work function layer 240 thereon. As a result, only moderate etching back may be needed to remove excess first work function layer 240. The etching back may also remove the first work function layer 240 deposited on the top hard mask 236. In some embodiments represented in FIG. 9, after the etching back, a top surface of the first work function layer 240 may be higher than top surfaces of the topmost bottom channel members 2080B but lower than top surfaces of the middle dielectric layer 220. That is, a top surface of the first work function layer 240 stays lower than or level with a bottom surface of—the bottommost top channel members 2080T. It is noted that the first work function layer 240 is spaced apart from the bottom channel members 2080B by the interfacial layer and the gate dielectric layer 232. It is noted that the first work function layer 240 does not completely wrap around the topmost bottom channel member 2080B because a top surface of the topmost bottom channel member 2080B is covered by the middle dielectric layer 220.

Figure 10:
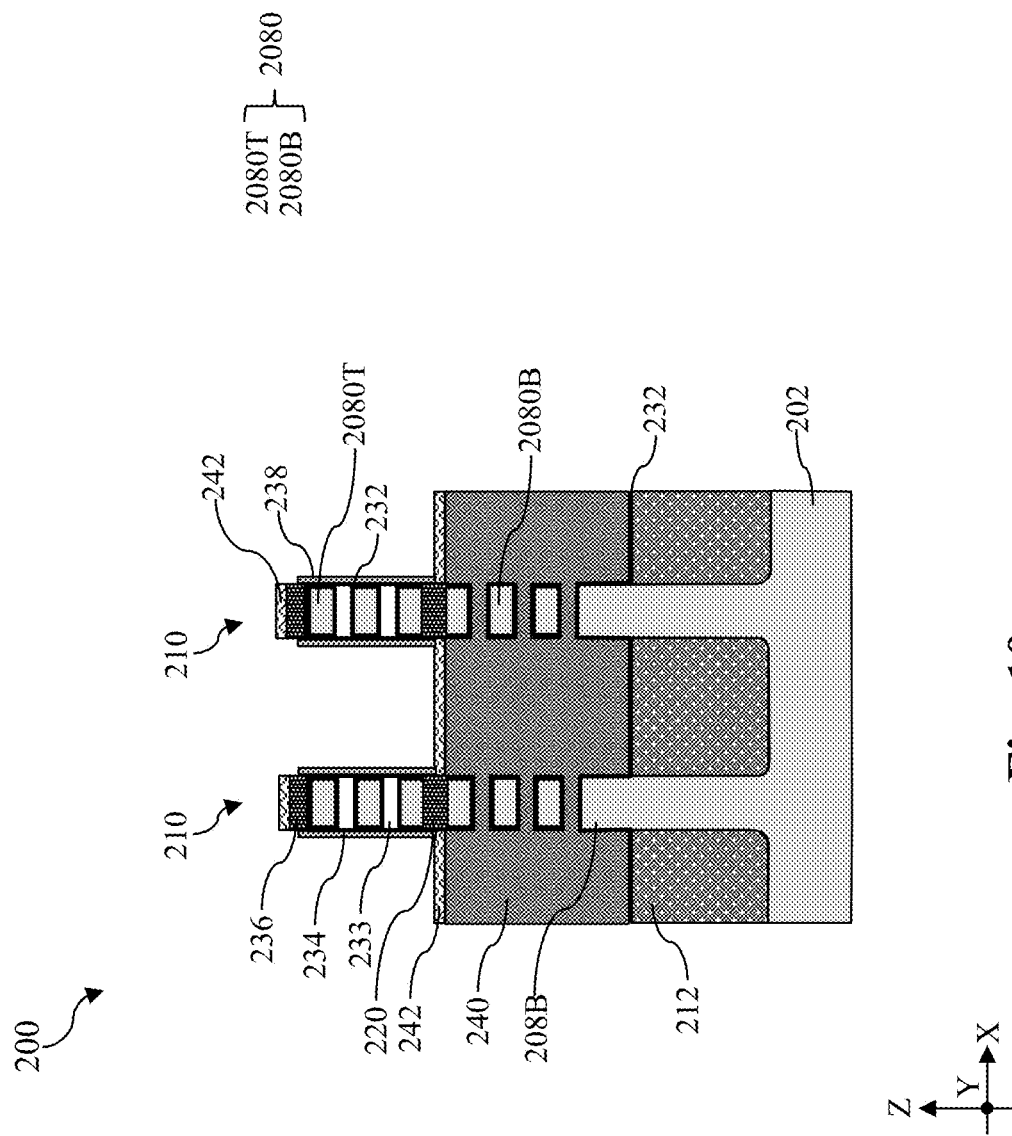

Referring to FIGS. 1 and 10-15, method 100 includes a block 130 wherein a gate isolation layer 242 is formed over a top surface of the first work function layer 240. Depending on the design, the bottom channel members 2080B and the top channel members 2080T may be activated simultaneously or separately. When the former is desired, the first work function layer 240 and the to-be-deposited second work function layer 250 are in direct contact without any intervening isolation layers to form a common gate. When the latter is desired, a gate isolation layer 242 is deposited on the first work function layer 240 to provide a split gate construction. Operations at block 130 are performed when such a gate isolation layer 242 is desired. Referring to FIG. 10, a gate isolation material 242 is first conformally deposited over the workpiece 200. Due to the presence of the blocking layer 238 that hinders deposition of the gate isolation material 242, little or no gate isolation material 242 is deposited on the dummy liner 234. As shown in FIG. 10, the gate isolation material 242 may be deposited on top surfaces of the first work function layer 240 and top surfaces of the top hard mask 236. In some embodiments, the gate isolation material 242 includes a nitrogen-containing dielectric material, such as silicon nitride, silicon oxynitride, silicon carbonitride, or silicon oxycarbonitride. In one embodiment, the gate isolation material 242 includes silicon nitride. The gate isolation material 242 may be deposited using ALD.

Figure 11:
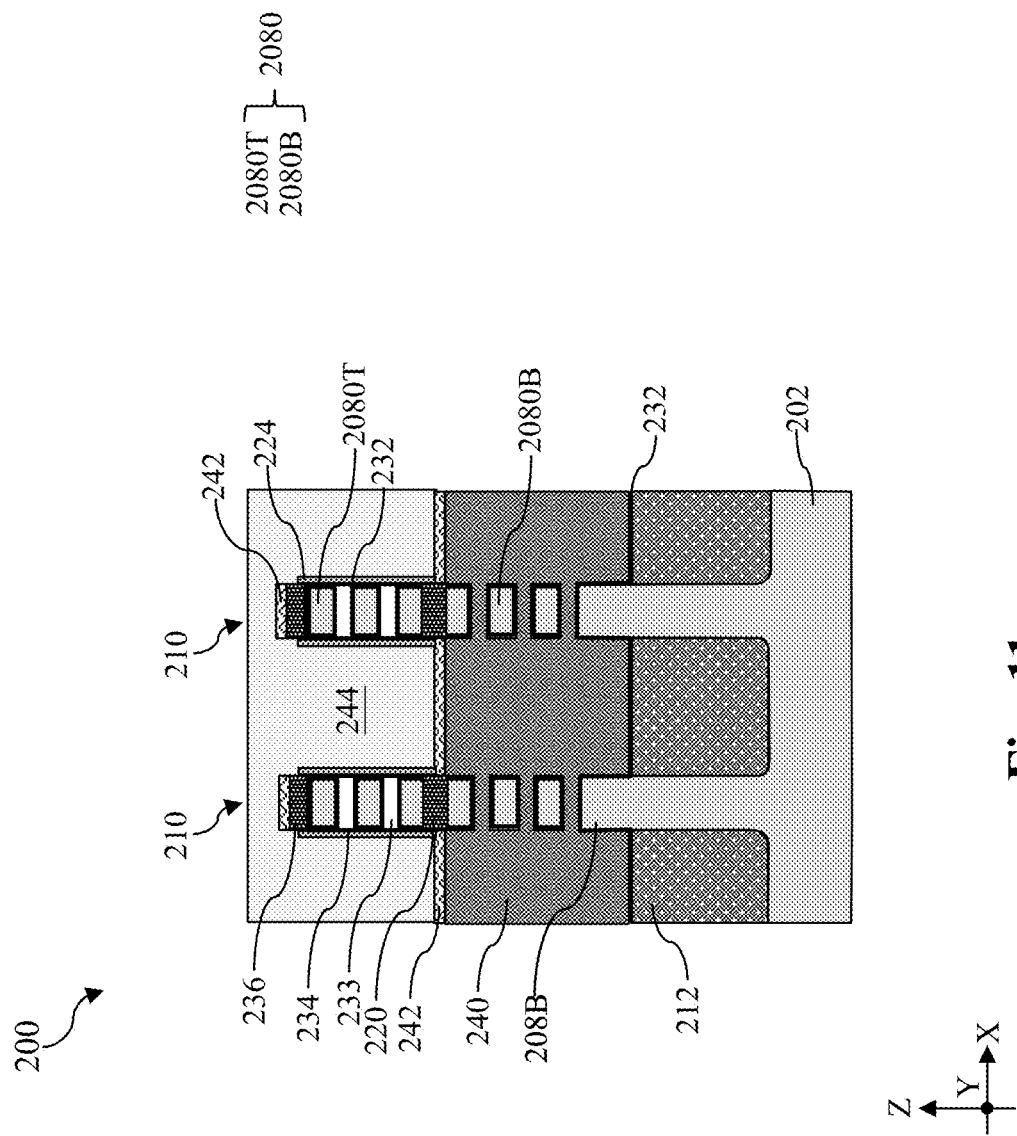
Figure 12:
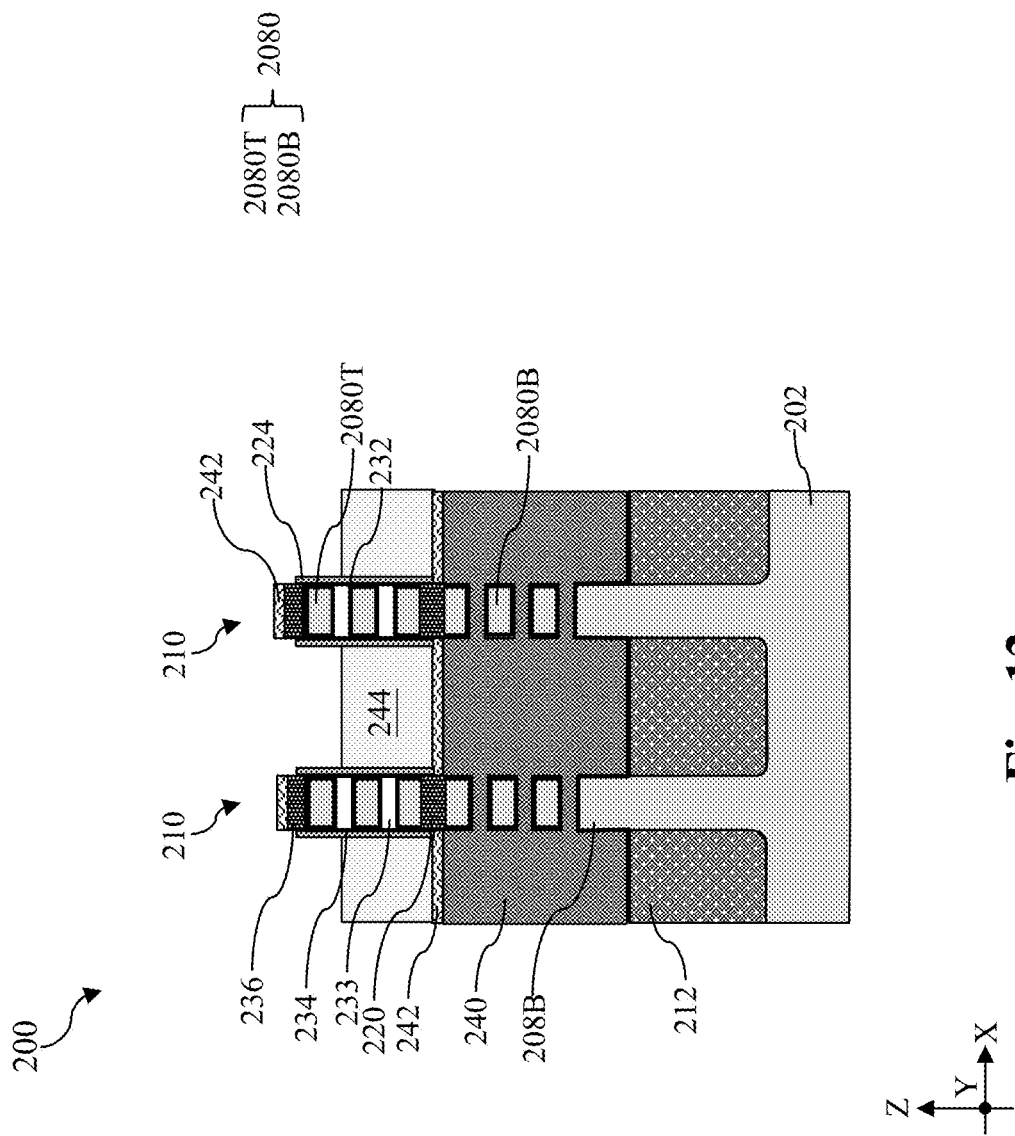
Figure 13:
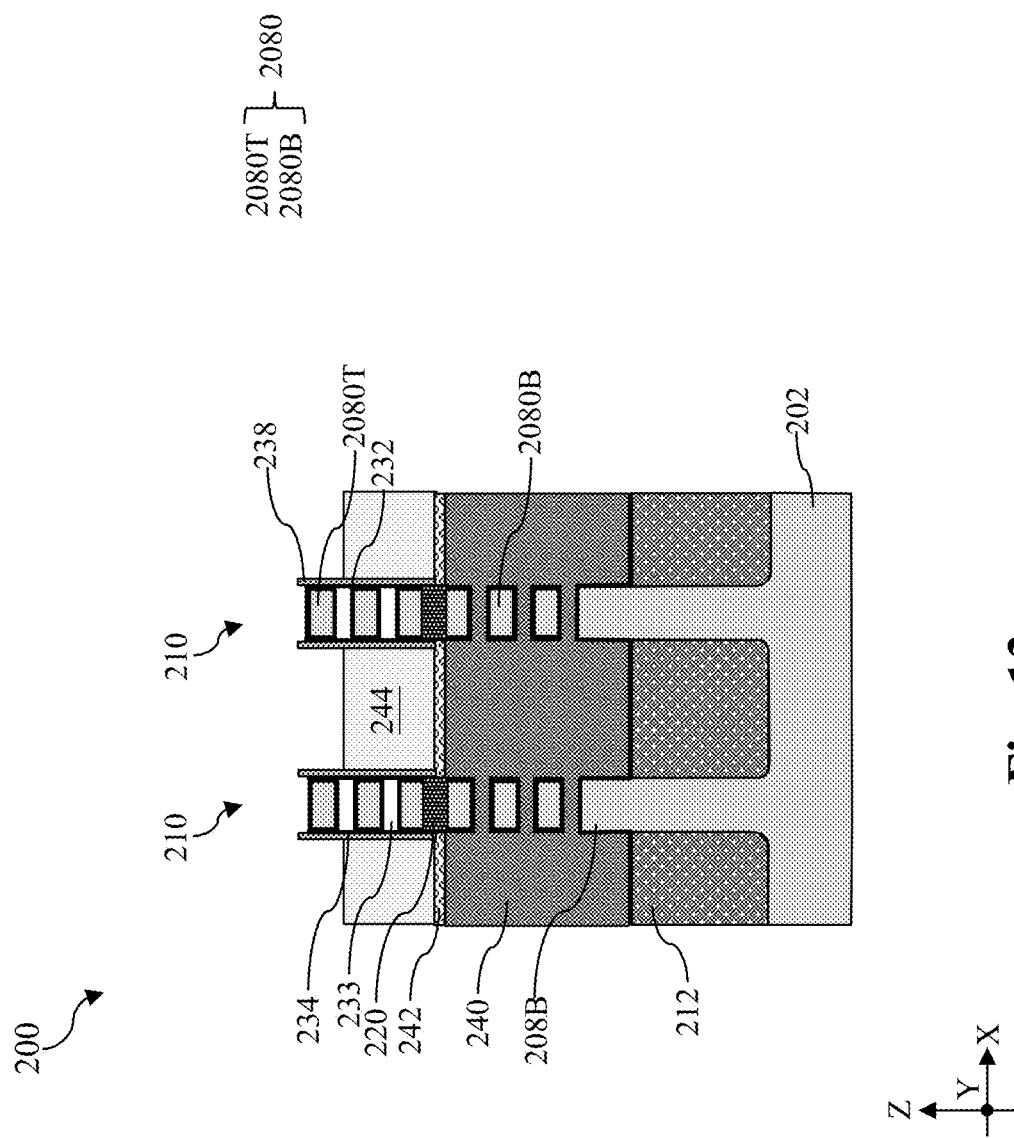
Figure 14:
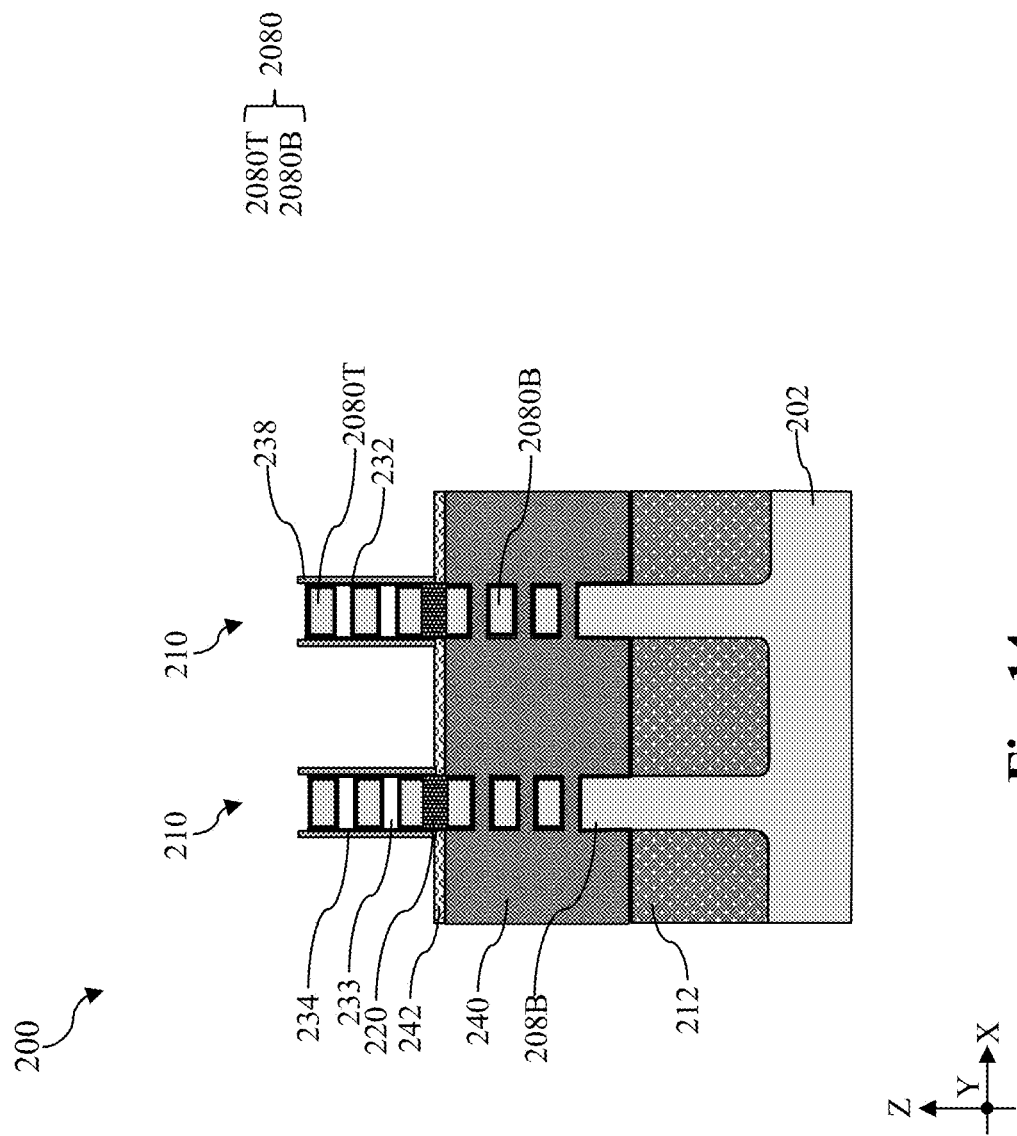
Figure 15:
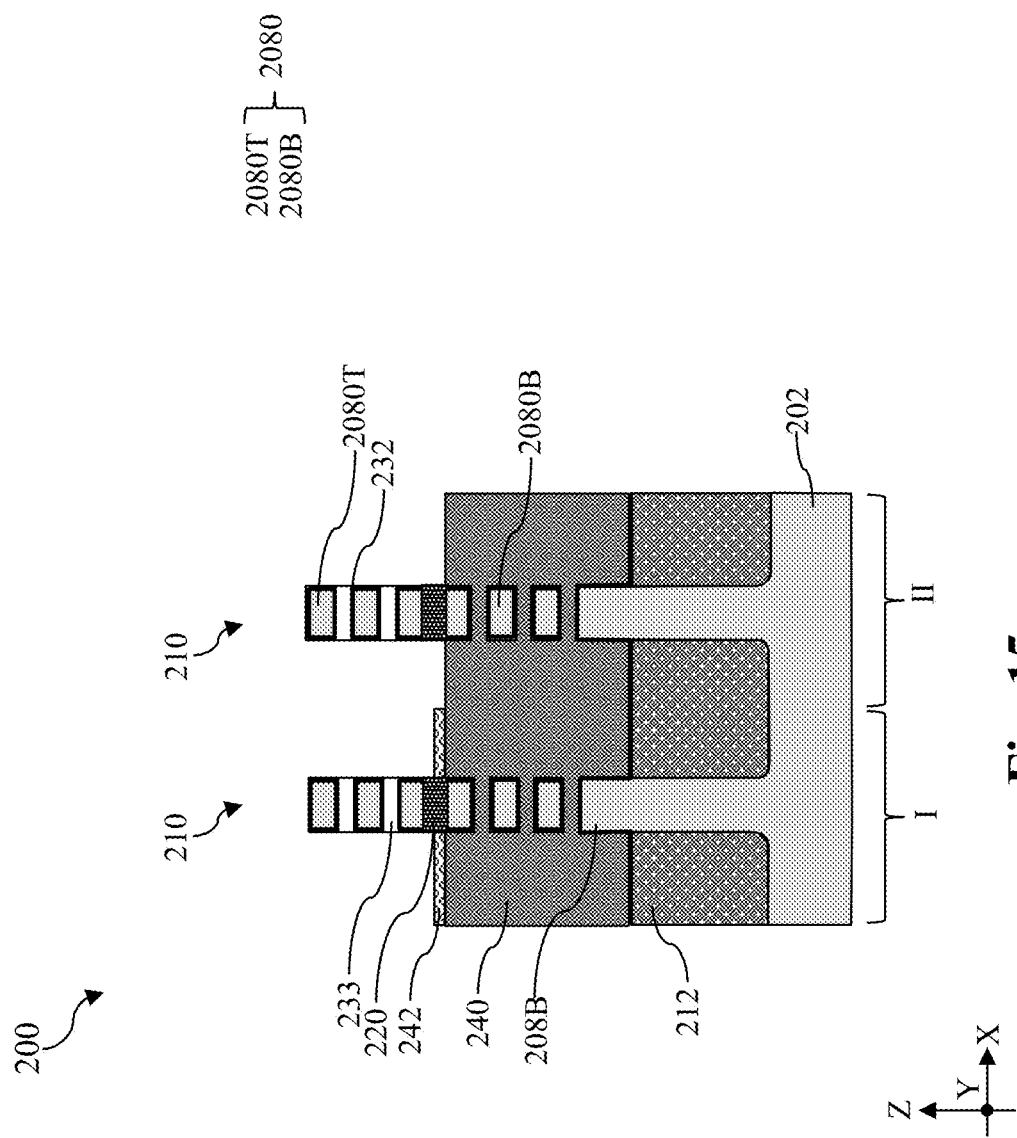

Reference is now made to FIG. 11. After the deposition of the gate isolation material 242, a second dummy fill 244 is deposited over the workpiece 200, including over the gate isolation material 242, the blocking layer 238, and the top hard mask 236. In other words, the second dummy fill 244 wraps over the top channel members 2080T. A composition of the second dummy fill 244 is different from a composition of the first dummy fill 237. In some embodiments, the second dummy fill 244 includes a BARC material that includes silicon (Si), oxygen (O), carbon (C), and hydrogen (H), while the first dummy fill 237 includes silicon oxide. Reference is then made to FIG. 12. The second dummy fill 244 is then etched back to expose the top hard mask 236 and the gate isolation material 242 on the top hard mask 236. In some embodiments, both the hard mask 236 and the gate isolation material 242 are formed of silicon nitride and may be selectively removed using a wet etch that uses phosphoric acid ($H_3PO_4$), as shown in FIG. 13. Referring to FIG. 14, after the removal of the top hard mask 236, the second dummy fill 244 is removed by ashing or selective etching. The leftover gate isolation material 242 on the top surface of the first work function layer 240 may now be referred to as the gate isolation layer 242. In some embodiments represented in FIG. 15, the workpiece 200 may include a first region I and a second region II. In the first region I, the first work function layer 240 is electrically isolated from the second work function layer 250 by a gate isolation layer 242 while the first work function layer 240 and the second work function layer 250 in the second region II are in direct and electrical contact with one another. The gate isolation layer 242 in FIG. 15 may be formed if the processes illustrated in FIGS. 10-14 are performed while the second region II is covered by, for example, a BARC layer.

Figure 16:
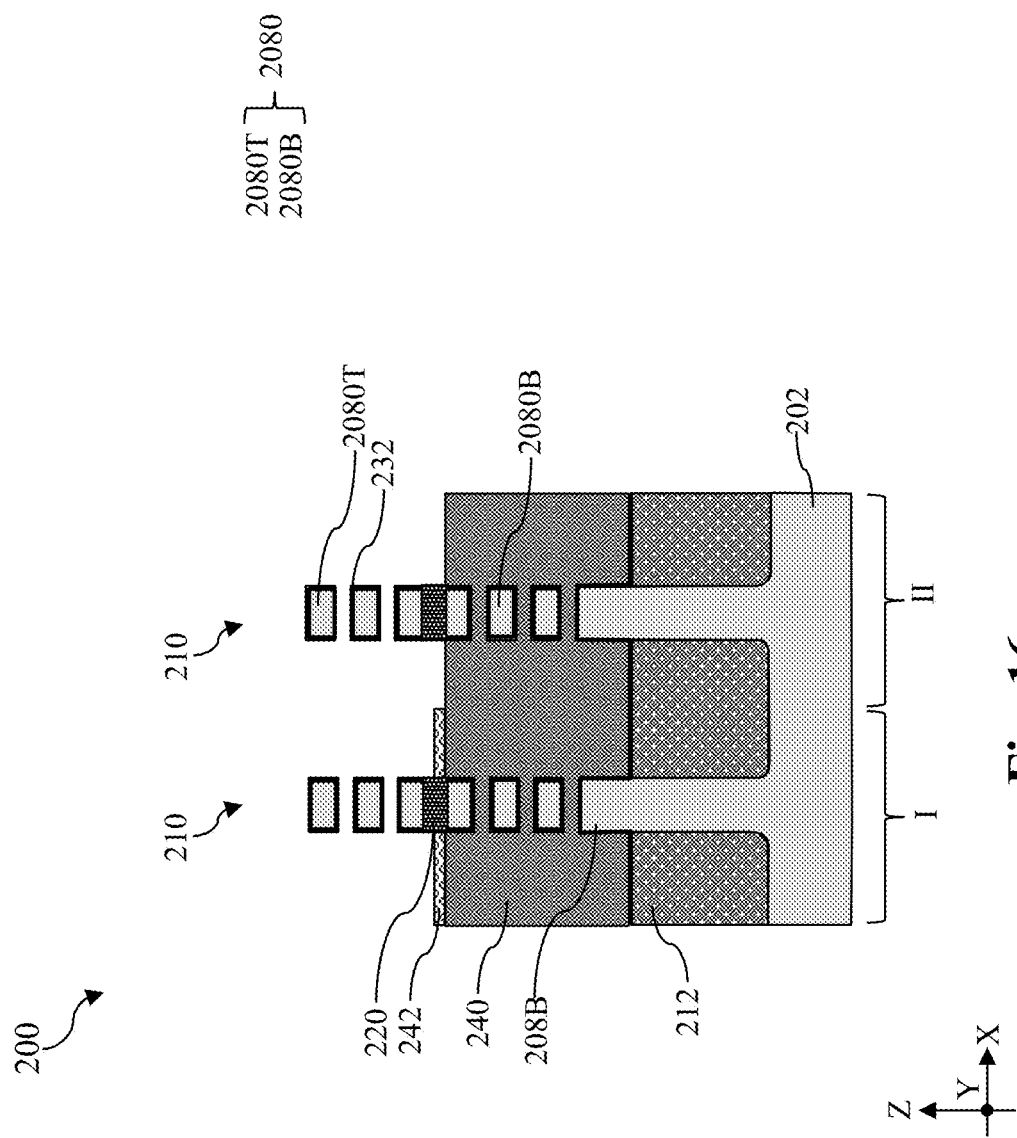

Referring to FIGS. 1 and 16, method 100 includes a block 132 wherein the top channel members 2080T are released. At block 132, the dielectric plugs 233 interleaving the top channel members 2080T are removed using an aqueous solution of ammonium hydroxide. With the removal of the dielectric plugs 233, the top channel members 2080T are released again. It is noted that the interfacial layer and the gate dielectric layer 232 remains on surfaces of the top channel members 2080T.

Figure 17:
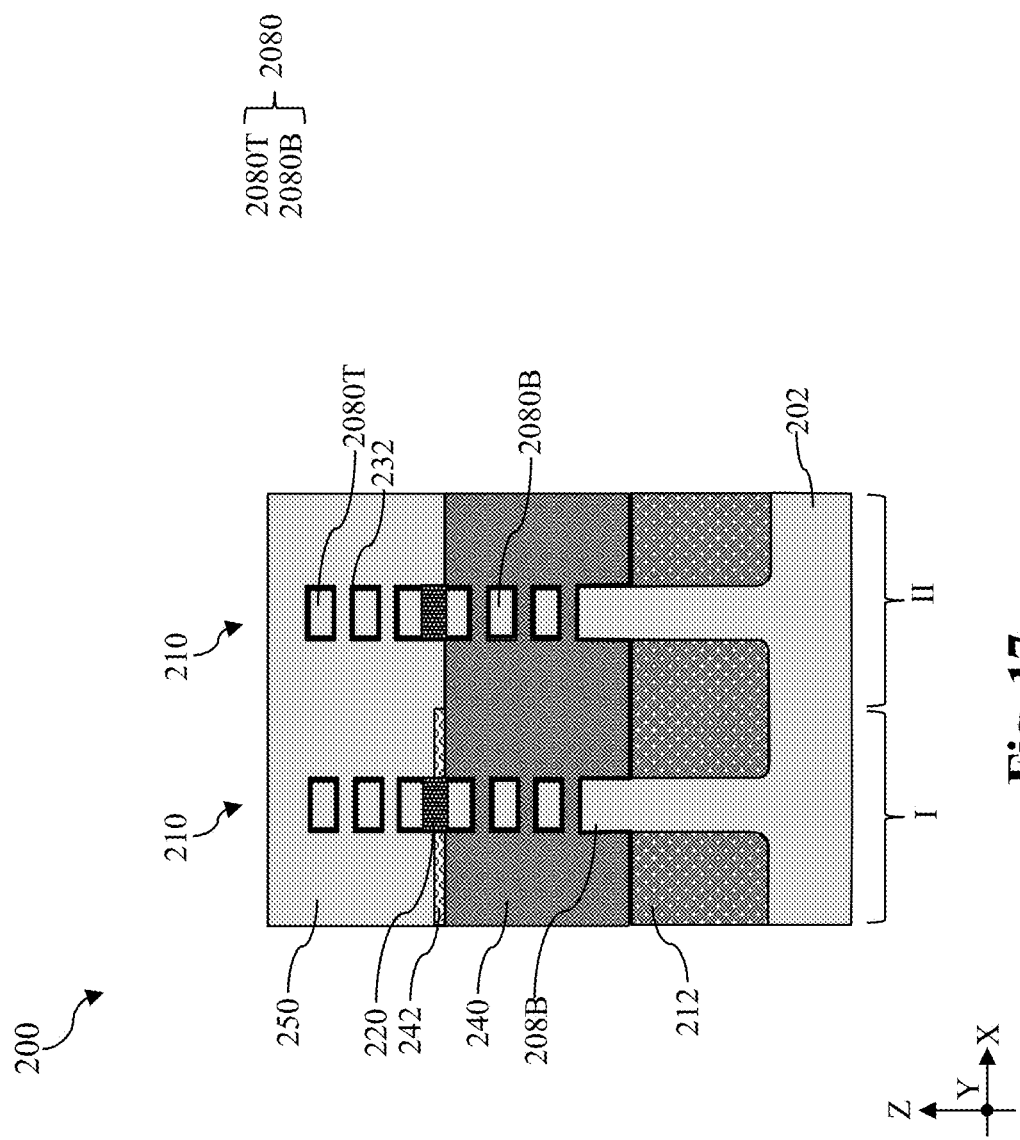

Referring to FIGS. 1 and 17, method 100 includes a block 134 wherein a second work function layer 250 is deposited to wrap around each of the top channel members 2080T. With the top channel members 2080T released, the second work function layer 250 is deposited to wrap around each of the top channel members 2080T. Depending on the design of the semiconductor device, the second work function layer 250 may be an n-type work function layer or a p-type work function layer. The second work function layer 250 may include a single layer or alternatively a multi-layer structure, such as various combinations of a metal layer with a selected work function to enhance the device performance. In the depicted embodiments, the second work function layer 250 is an n-type work function layer and may include titanium (Ti), aluminum (Al), silver (Ag), manganese (Mn), zirconium (Zr), titanium aluminum (TiAl), titanium aluminum carbide (TiAlC), tantalum carbide (TaC), tantalum carbonitride (TaCN), tantalum silicide nitride (TaSiN), tantalum aluminum (TaAl), tantalum aluminum carbide (TaAlC), titanium aluminum nitride (TiAlN), other n-type work function material, or combinations thereof. In one embodiment, the second work function layer 250 includes titanium aluminum (TiAl). The second work function layer 250 may be deposited using ALD. In some embodiments represented in FIG. 17, after the deposition of the second work function layer 250, a glue layer and a gate cap layer may be deposited on the second work function layer 250. The glue layer may include titanium nitride (TiN) and the gate cap layer may include tungsten (W). After the deposition of the glue layer and the gate cap layer, the workpiece 200 may be planarized using a CMP process to remove excess materials and to provide a planar top surface. It is noted that the second work function layer 250 does not completely wrap around the bottommost top channel member 2080T because a bottom surface of the bottommost top channel member 2080T is covered by the middle dielectric layer 220.

Figure 18:
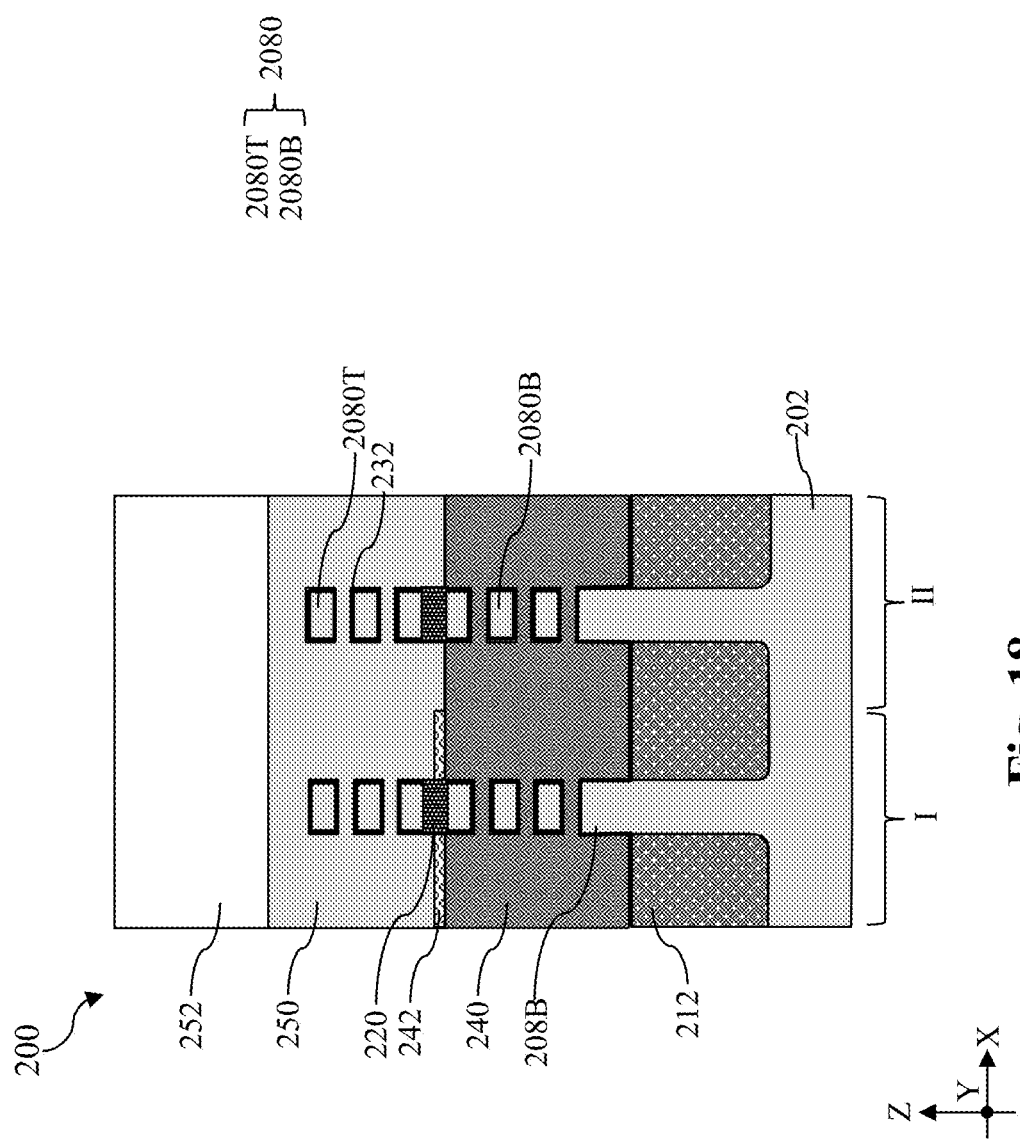
Figure 19:
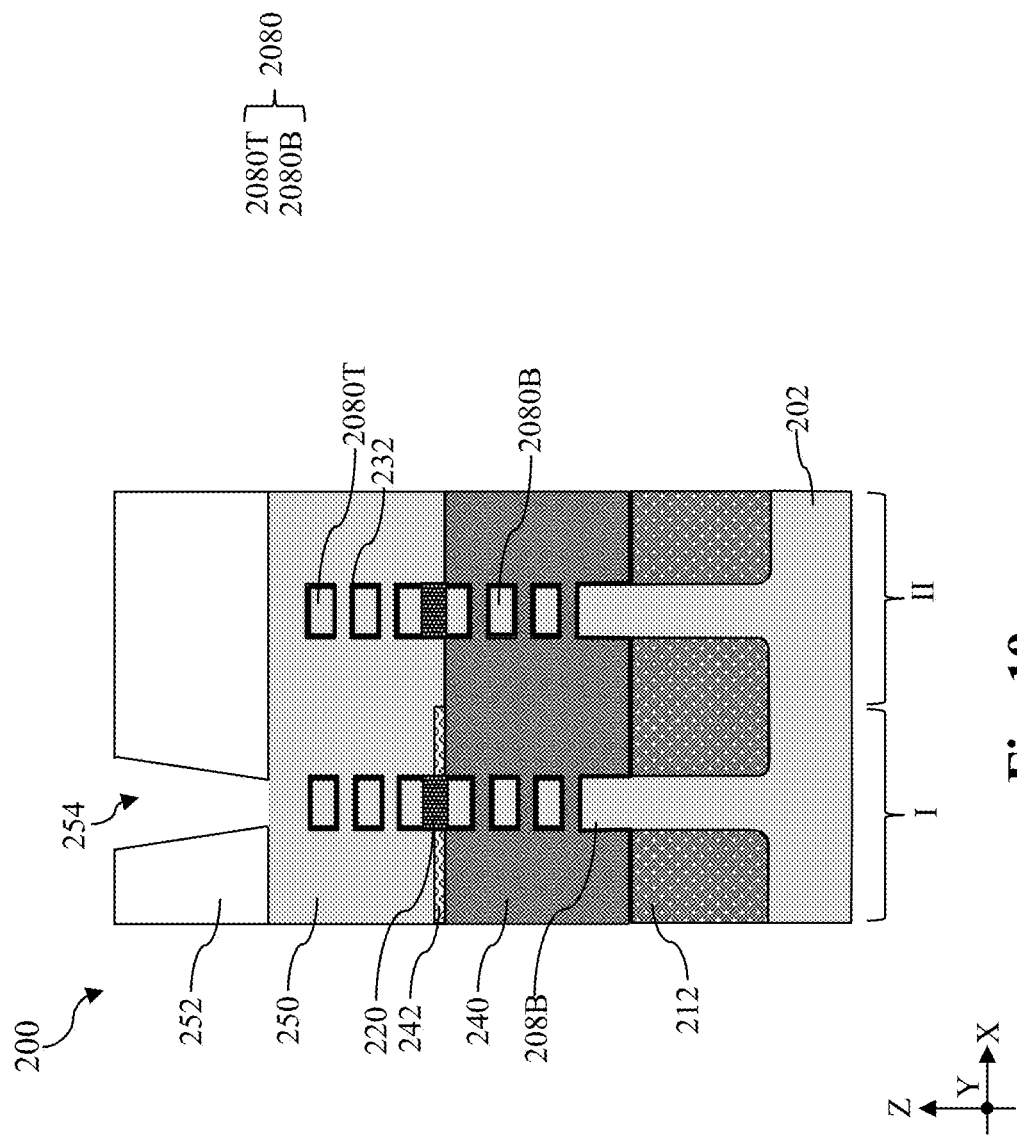
Figure 20:
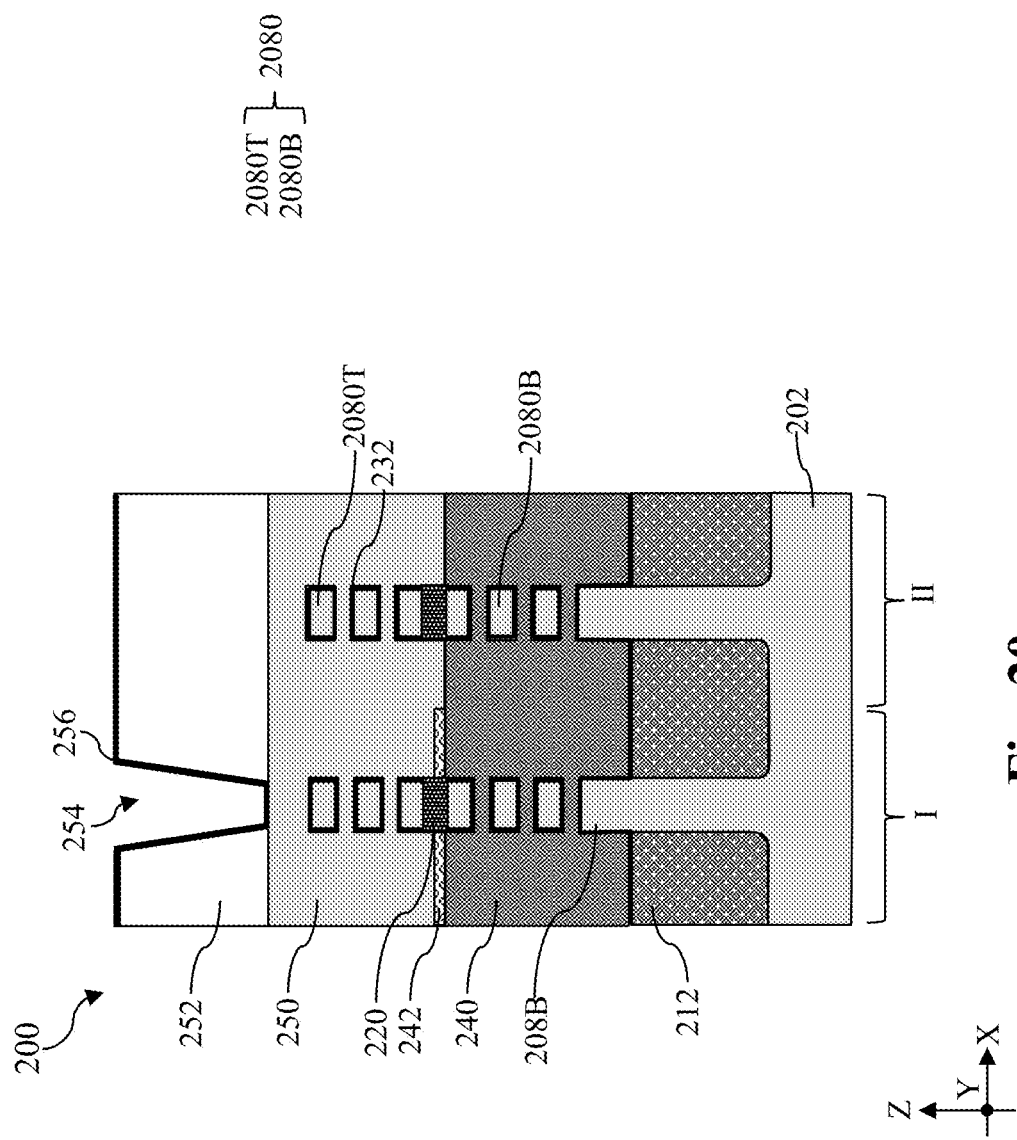
Figure 21:
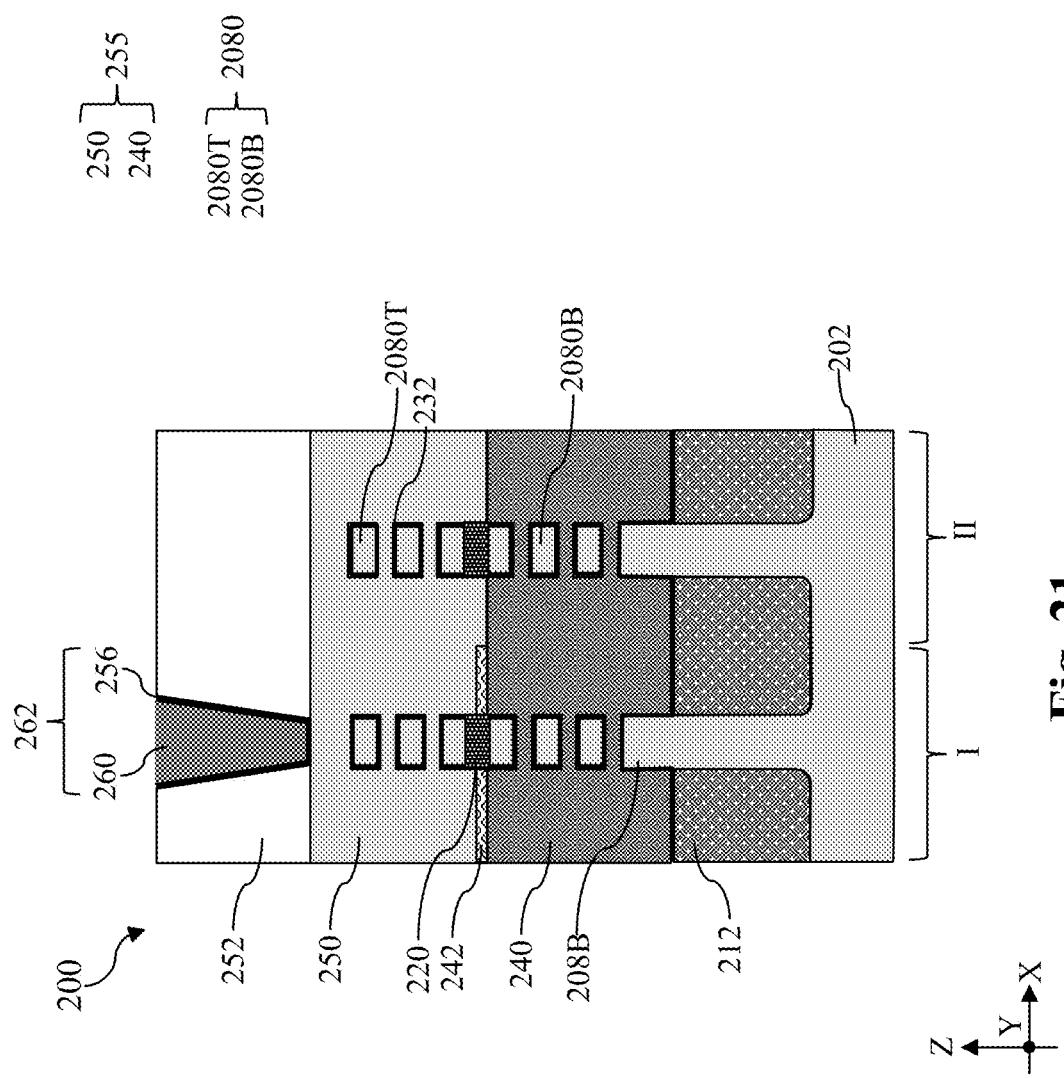

Referring to FIGS. 1 and 18-21, method 100 includes a block 136 where a gate contact via 260 is formed to coupled to the gate structure 255. After the planarization at block 134, an interlayer dielectric (ILD) layer 252 is deposited over the workpiece 200 by spin-on coating, FCVD, CVD, or other suitable deposition technique, as shown in FIG. 18 The ILD layer 252 may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. Referring to FIG. 19, a gate contact opening 254 is formed through the ILD layer 252 to expose a portion of the second work function layer 250 (or the glue layer or gate cap layer deposited there). The forming of the gate contact opening 254 may include a dry etch process that uses an oxygen-containing gas, hydrogen, nitrogen, a fluorine-containing gas (e.g., $NF_3$, $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas (e.g., $CF_3I$), other suitable gases and/or plasmas, and/or combinations thereof. Referring to FIG. 20, a via glue layer 256 is blanketly deposited over the workpiece 200, including over the ILD layer 252 and the gate contact opening 254. In some embodiments, the via glue layer 256 may include titanium nitride (TiN) and may be deposited using ALD. In FIG. 21, a metal fill 260 is deposited over the workpiece 200 and the workpiece 200 is planarized to remove the excess via glue layer 256 and metal fill 260, thereby forming a gate contact via 262 extending through the ILD layer 252. In some embodiments, the metal fill 260 may include tungsten (W) and may be deposited using ALD or CVD. The gate contact via 262 includes the via glue layer 256 and the metal fill 260.

In one exemplary aspect, the present disclosure is directed to a method. The method includes depositing a titanium nitride (TiN) layer over a channel region that includes bottom channel layers and top channel layers over the bottom channel layers, depositing a dummy fill layer to cover sidewalls of the bottom channel layers, after the depositing of the dummy fill layer, selectively forming a blocking layer over the TiN layer along sidewalls of the top channel layers, selectively removing the dummy fill layer to release the bottom channel layers, selectively depositing a first work function metal layer to wrap around each of the bottom channel layers, forming a gate isolation layer over a top surface of the first work function metal layer, removing the blocking layer, releasing the top channel layers, and selectively depositing a second work function metal layer to wrap around each of the top channel layers.

In some embodiments, during the selectively depositing of the first work function metal layer, little or no of the first work function metal layer is deposited on the blocking layer. In some embodiments, the bottom channel layers are stacked one over another and before the depositing of the TiN layer and the bottom channel layers are interleaved by a first plurality of dielectric plug layers and the top channel layers are stacked one over another and before the depositing of the TiN layer and the top channel layers are interleaved by a second plurality of dielectric plug layers. In some implementations, the selectively removing includes selectively removing the first plurality of dielectric plug layers. In some instances, the releasing of the top channel layers includes selectively removing the second plurality of dielectric plug layers. In some embodiments, the first plurality of dielectric plug layers and the second plurality of dielectric plug layers includes aluminum oxide. In some embodiments, the method further includes before the depositing of the dummy fill layer, depositing a top hard mask on the TiN layer over the channel region. In some embodiments, the selectively forming of the blocking layer includes depositing a self-assembly precursor on the TiN layer not covered by the dummy fill layer and the self-assembly precursor is configured to form with titanium on the TiN layer a monodentate binding, a bridging bidentate binding, a bridging tridentate binding, or a chelating bidentate binding. In some implementations, the self-assembly precursor includes a phosphonic acid functional head group and a tail group including a hydrocarbon chain. In some instances, the self-assembly precursor includes hexylphosphonic acid (HPA), dodecylphosphonic acid (DDPA), octadecylphosphonic acid (ODPA), 16-phosphonohexadecanoic acid (PHDA), 12-mercaptododecylphosphonic acid (MDPA), 12-pentafluorophenoxydodecylphosphonic acid (PFPA), or 11-hydroxyundecylphosphonic acid (HUPA).

In another exemplary aspect, the present disclosure is directed to a method. The method includes receiving a workpiece that includes a substrate, a fin arising from the substrate, a bottom channel members disposed over the fin, a middle dielectric layer over the bottom channel members, a top channel members over the middle dielectric layer, a gate dielectric layer disposed over surfaces of the bottom channel members and the top channel members, a first plurality of plug layers interleaving the bottom channel members, and a second plurality of plug layers interleaving the top channel members, depositing a titanium-containing layer over sidewall of the bottom channel members, sidewalls of the first plurality of plug layers, sidewalls of the middle dielectric layer, sidewalls of the top channel members, and sidewalls of the second plurality of plug layers, depositing a dummy fill layer over the workpiece such that a top surface of the dummy fill layer is substantially coplanar with a bottom surface of the middle dielectric layer, after the depositing of the dummy fill layer, selectively forming a blocking layer over the titanium-containing layer along sidewalls of the top channel members, selectively removing the dummy fill layer, the titanium-containing layer not covered by the blocking layer, and the first plurality of plug layers to release the bottom channel members, selectively depositing a first work function metal layer to wrap around each of the bottom channel members, forming a gate isolation layer over a top surface of the first work function metal layer, removing the blocking layer, selectively removing the second plurality of plug layers to release the top channel members, and selectively depositing a second work function metal layer to wrap around each of the top channel members.

In some embodiments, the titanium-containing layer includes titanium nitride. In some implementations, the selectively forming of the blocking layer includes depositing a self-assembly precursor on the titanium-containing layer not covered by the dummy fill layer. The self-assembly precursor is configured to form with titanium on the titanium-containing layer a monodentate binding, a bridging bidentate binding, a bridging tridentate binding, or a chelating bidentate binding. In some embodiments, the self-assembly precursor includes hexylphosphonic acid (HPA), dodecylphosphonic acid (DDPA), octadecylphosphonic acid (ODPA), 16-phosphonohexadecanoic acid (PHDA), 12-mercaptododecylphosphonic acid (MDPA), 12-pentafluorophenoxydodecylphosphonic acid (PFPA), or 11-hydroxyundecylphosphonic acid (HUPA). In some instances, the first work function metal layer includes titanium nitride (TiN) and the second work function metal layer includes titanium aluminide (TiAl).

In yet another exemplary aspect, the present disclosure is directed to a method. The method includes depositing a titanium-containing layer over a channel region that includes bottom channel members and top channel members over the bottom channel members, forming a top hard mask on a top surface of the titanium-containing layer, after the forming of the top hard mask, depositing a first dummy fill layer to cover the titanium-containing layer along sidewalls of the bottom channel members, after the depositing of the first dummy fill layer, selectively forming a blocking layer to cover the titanium-containing layer along sidewalls of the top channel members, selectively removing the first dummy fill layer to release the bottom channel members, selectively depositing a first work function metal layer to wrap around each of the bottom channel members, after the selectively depositing of the first work function metal layer, forming a gate isolation layer over the first work function metal layer and the top hard mask, after the forming of the gate isolation layer, removing the top hard mask, removing the blocking layer, releasing the top channel members, and selectively depositing a second work function metal layer to wrap around each of the top channel members.

In some embodiments, the removing of the top hard mask includes depositing a second dummy fill layer over the gate isolation layer and the blocking layer, etching back the second dummy fill layer to expose the top hard mask, removing the top hard mask, and after the removing of the top hard mask, removing the second dummy fill layer. In some implementations, a composition of the first dummy fill layer is different from a composition of the second dummy fill layer. In some instances, the selectively forming of the blocking layer includes depositing a self-assembly precursor on the titanium-containing layer not covered by the first dummy fill layer. The self-assembly precursor is configured to form with titanium on the titanium-containing layer a monodentate binding, a bridging bidentate binding, a bridging tridentate binding, or a chelating bidentate binding. In some embodiments, the self-assembly precursor includes hexylphosphonic acid (HPA), dodecylphosphonic acid (DDPA), octadecylphosphonic acid (ODPA), 16-phosphonohexadecanoic acid (PHDA), 12-mercaptododecylphosphonic acid (MDPA), 12-pentafluorophenoxydodecylphosphonic acid (PFPA), or 11-hydroxyundecylphosphonic acid (HUPA).

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   depositing a titanium nitride (TiN) layer over a channel region that includes bottom channel layers and top channel layers over the bottom channel layers;
   depositing a dummy fill layer to cover sidewalls of the bottom channel layers;
   after the depositing of the dummy fill layer, selectively forming a blocking layer over the TiN layer along sidewalls of the top channel layers;
   selectively removing the dummy fill layer to release the bottom channel layers;
   selectively depositing a first work function metal layer to wrap around each of the bottom channel layers;
   forming a gate isolation layer over a top surface of the first work function metal layer;
   removing the blocking layer;
   releasing the top channel layers; and
   selectively depositing a second work function metal layer to wrap around each of the top channel layers.

2. The method of claim 1, wherein, during the selectively depositing of the first work function metal layer, little or no of the first work function metal layer is deposited on the blocking layer.

3. The method of claim 1,
   wherein the bottom channel layers are stacked one over another and before the depositing of the TiN layer and the bottom channel layers are interleaved by a first plurality of dielectric plug layers,
   wherein the top channel layers are stacked one over another and before the depositing of the TiN layer and the top channel layers are interleaved by a second plurality of dielectric plug layers.

4. The method of claim 3, wherein the selectively removing comprises selectively removing the first plurality of dielectric plug layers.

5. The method of claim 3, wherein the releasing of the top channel layers comprises selectively removing the second plurality of dielectric plug layers.

6. The method of claim 3, wherein the first plurality of dielectric plug layers and the second plurality of dielectric plug layers comprise aluminum oxide.

7. The method of claim 1, further comprising:
   before the depositing of the dummy fill layer, depositing a top hard mask on the TiN layer over the channel region.

8. The method of claim 1,
   wherein the selectively forming of the blocking layer comprises depositing a self-assembly precursor on the TiN layer not covered by the dummy fill layer,
   wherein the self-assembly precursor is configured to form with titanium on the TiN layer a monodentate binding, a bridging bidentate binding, a bridging tridentate binding, or a chelating bidentate binding.

9. The method of claim 8, wherein the self-assembly precursor comprises a phosphonic acid functional head group and a tail group comprising a hydrocarbon chain.

10. The method of claim 8, wherein the self-assembly precursor comprises hexylphosphonic acid (HPA), dodecylphosphonic acid (DDPA), octadecylphosphonic acid (ODPA), 16-phosphonohexadecanoic acid (PHDA), 12-mercaptododecylphosphonic acid (MDPA), 12-pentafluorophenoxydodecylphosphonic acid (PFPA), or 11-hydroxyundecylphosphonic acid (HUPA).

11. A method, comprising:
    receiving a workpiece that comprises:
      a substrate,
      a fin arising from the substrate,
      a bottom channel members disposed over the fin,
      a middle dielectric layer over the bottom channel members,
      a top channel members over the middle dielectric layer,
      a gate dielectric layer disposed over surfaces of the bottom channel members and the top channel members,
      a first plurality of plug layers interleaving the bottom channel members, and
      a second plurality of plug layers interleaving the top channel members;
    depositing a titanium-containing layer over sidewall of the bottom channel members, sidewalls of first plurality of plug layers, sidewalls of the middle dielectric layer, sidewalls of the bottom channel members, and sidewalls of the second plurality of plug layers;
    depositing a dummy fill layer over the workpiece such that a top surface of the dummy fill layer is substantially coplanar with a bottom surface of the middle dielectric layer;
    after the depositing of the dummy fill layer, selectively forming a blocking layer over the titanium-containing layer along the sidewalls of the top channel members;
    selectively removing the dummy fill layer, the titanium-containing layer not covered by the blocking layer, and the first plurality of plug layers to release the bottom channel members;
    selectively depositing a first work function metal layer to wrap around each of the bottom channel members;
    forming a gate isolation layer over a top surface of the first work function metal layer;
    removing the blocking layer;
    selectively removing the second plurality of plug layers to release the top channel members; and
    selectively depositing a second work function metal layer to wrap around each of the top channel members.

12. The method of claim 11, wherein the titanium-containing layer comprises titanium nitride.

13. The method of claim 11,
wherein the selectively forming of the blocking layer comprises depositing a self-assembly precursor on the titanium-containing layer not covered by the dummy fill layer,
wherein the self-assembly precursor is configured to form with titanium on the titanium-containing layer a monodentate binding, a bridging bidentate binding, a bridging tridentate binding, or a chelating bidentate binding.

14. The method of claim 13, wherein the self-assembly precursor comprises hexylphosphonic acid (HPA), dodecylphosphonic acid (DDPA), octadecylphosphonic acid (ODPA), 16-phosphonohexadecanoic acid (PHDA), 12-mercaptododecylphosphonic acid (MDPA), 12-pentafluorophenoxydodecylphosphonic acid (PFPA), or 11-hydroxyundecylphosphonic acid (HUPA).

15. The method of claim 11,
wherein the first work function metal layer comprises titanium nitride (TiN),
wherein the second work function metal layer comprises titanium aluminide (TiAl).

16. A method, comprising:
depositing a titanium-containing layer over a channel region that includes bottom channel members and top channel members over the bottom channel members;
forming a top hard mask on a top surface of the titanium-containing layer;
after the forming of the top hard mask, depositing a first dummy fill layer to cover the titanium-containing layer along sidewalls of the bottom channel members;
after the depositing of the first dummy fill layer, selectively forming a blocking layer to cover the titanium-containing layer along sidewalls of the top channel members;
selectively removing the first dummy fill layer to release the bottom channel members;
selectively depositing a first work function metal layer to wrap around each of the bottom channel members;
after the selectively depositing of the first work function metal layer, forming a gate isolation layer over the first work function metal layer and the top hard mask;
after the forming of the gate isolation layer, removing the top hard mask;
removing the blocking layer;
releasing the top channel members; and
selectively depositing a second work function metal layer to wrap around each of the top channel members.

17. The method of claim 16, wherein the removing of the top hard mask comprises:
depositing a second dummy fill layer over the gate isolation layer and the blocking layer;
etching back the second dummy fill layer to expose the top hard mask;
removing the top hard mask; and
after the removing of the top hard mask, removing the second dummy fill layer.

18. The method of claim 17, wherein a composition of the first dummy fill layer is different from a composition of the second dummy fill layer.

19. The method of claim 16,
wherein the selectively forming of the blocking layer comprises depositing a self-assembly precursor on the titanium-containing layer not covered by the first dummy fill layer,
wherein the self-assembly precursor is configured to form with titanium on the titanium-containing layer a monodentate binding, a bridging bidentate binding, a bridging tridentate binding, or a chelating bidentate binding.

20. The method of claim 19, wherein the self-assembly precursor comprises hexylphosphonic acid (HPA), dodecylphosphonic acid (DDPA), octadecylphosphonic acid (ODPA), 16-phosphonohexadecanoic acid (PHDA), 12-mercaptododecylphosphonic acid (MDPA), 12-pentafluorophenoxydodecylphosphonic acid (PFPA), or 11-hydroxyundecylphosphonic acid (HUPA).

* * * * *